(12) United States Patent
Li et al.

(10) Patent No.: US 10,975,302 B2
(45) Date of Patent: *Apr. 13, 2021

(54) COATED NARROW BAND RED PHOSPHOR

(71) Applicant: Intematix Corporation, Fremont, CA (US)

(72) Inventors: Yi-Qun Li, Danville, CA (US);
Xiongfei Shen, Fremont, CA (US);
Haoguo Zhu, Fremont, CA (US);
Kuanping Gong, Union City, CA (US);
Samuel Lowell Dunscombe, Albany, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/375,848

(22) Filed: Apr. 4, 2019

(65) Prior Publication Data
US 2019/0241806 A1 Aug. 8, 2019

Related U.S. Application Data

(63) Continuation of application No. 15/075,080, filed on Mar. 18, 2016, now Pat. No. 10,253,257.

(60) Provisional application No. 62/260,230, filed on Nov. 25, 2015.

(51) Int. Cl.
| | | |
|---|---|---|
| *C09K 11/88* | (2006.01) | |
| *C23C 16/40* | (2006.01) | |
| *C23C 16/44* | (2006.01) | |
| *H01L 33/50* | (2010.01) | |
| *C09K 11/02* | (2006.01) | |
| *C23C 16/442* | (2006.01) | |

(52) U.S. Cl.
CPC ............ *C09K 11/886* (2013.01); *C09K 11/02* (2013.01); *C09K 11/025* (2013.01); *C23C 16/402* (2013.01); *C23C 16/403* (2013.01); *C23C 16/405* (2013.01); *C23C 16/442* (2013.01); *C23C 16/4417* (2013.01); *H01L 33/502* (2013.01); *H01L 33/505* (2013.01); *H01L 33/504* (2013.01); *H01L 2224/48091* (2013.01); *H01L 2224/48247* (2013.01); *H01L 2224/48465* (2013.01); *H01L 2224/49107* (2013.01); *H01L 2224/73265* (2013.01); *H01L 2924/181* (2013.01)

(58) Field of Classification Search
CPC ..... C09K 11/886; C09K 11/02; H01L 33/502; H01L 33/504
See application file for complete search history.

(56) References Cited

U.S. PATENT DOCUMENTS

| | | | |
|---|---|---|---|
| 5,958,591 | A | 9/1999 | Budd |
| 10,253,257 | B2 * | 4/2019 | Li .................. C23C 16/403 |
| 2005/0199897 | A1 | 9/2005 | Setlur et al. |
| 2007/0125984 | A1 | 6/2007 | Tian et al. |
| 2010/0283382 | A1 | 11/2010 | Kwak et al. |
| 2012/0199793 | A1 | 8/2012 | Weimer et al. |
| 2014/0128676 | A1 | 5/2014 | Law |

FOREIGN PATENT DOCUMENTS

| | | | |
|---|---|---|---|
| CN | 101336479 | A | 12/2008 |
| CN | 102473827 | A | 5/2012 |
| CN | 103717701 | A | 4/2014 |
| JP | S59105074 | A | 6/1984 |
| JP | 2002-544365 | * | 12/2002 |
| JP | 2009-256089 | * | 7/2009 |
| JP | 2014-519540 | * | 8/2014 |
| JP | 2017-008203 | * | 1/2017 |
| WO | WO2012166855 | | 12/2012 |
| WO | 2014128676 | A1 | 8/2014 |
| WO | WO2016146688 | | 9/2016 |

OTHER PUBLICATIONS

Chinese Office Action 201680078339.0; dated Nov. 15, 2019.
Office Action 10-2018-7017571.
Notice of Decision for Rejection, dated Apr. 2020; KR 10-2018-7017571.
Office Action dated Mar. 2020, JP Application 2018-526892.
Office Action, dated Jun. 2020, application CN 201680078339.
Shin, Jung-Sik, et. al.; Luminescence characterization of (Ca1-xSrx)(S1-ySey):Eu2+,M3+ (M=SC and Y) for high color rendering white LED; Materials Chemistry and Physics 126(2011) 591-595; Jan. 7, 2011.
Office Action, dated Aug. 2020; KR10-2020-7019142.

* cited by examiner

*Primary Examiner* — C Melissa Koslow
(74) *Attorney, Agent, or Firm* — CrossPond Law

(57) ABSTRACT

A coated phosphor comprises: phosphor particles comprised of a phosphor with composition $MSe_{1-x}S_x$:Eu, wherein M is at least one of Mg, Ca, Sr, Ba and Zn and $0<x<1.0$; and a coating on individual ones of the phosphor particles, the coating comprising a layer of oxide material encapsulating the individual phosphor particles; wherein the coated phosphor is configured such that under excitation by a blue LED the reduction in photoluminescent intensity at the peak emission wavelength after 1,000 hours of aging at about 85° C. and about 85% relative humidity is no greater than about 15%; and wherein the coated phosphor is configured such that the change in chromaticity coordinates CIE(x), Δx, after 1,000 hours of aging at about 85° C. and about 85% relative humidity is less than or equal to about $5\times10^{-3}$.

12 Claims, 24 Drawing Sheets

Area 1

Area 2

Area 3

Area 4

SECTION A-A

COATED NARROW BAND RED PHOSPHOR

CROSS-REFERENCE TO RELATED APPLICATIONS

This application is a continuation of U.S. Pat. No. 10,253,257, issued Apr. 9, 2019, which in turn claims the benefit of priority to U.S. Provisional Application No. 62/260,230, filed Nov. 25, 2015, both of which are hereby incorporated by reference in their entirety.

FIELD OF THE INVENTION

Embodiments of the present invention are directed to coated narrow band red phosphors with general composition $MSe_{1-x}S_x$:Eu, wherein M is at least one of Mg, Ca, Sr, Ba and Zn and $0<x<1.0$ and the coating is an oxide chosen from the group of materials consisting of aluminum oxide, silicon oxide, titanium oxide, zinc oxide, magnesium oxide, zirconium oxide and chromium oxide, and light emitting devices including the same.

BACKGROUND OF THE INVENTION

Warm white light emitting diodes (LEDs) with high-color-rendering index (CRI, Ra>80) and low correlated color temperature (CCT<4500K) need a suitable red phosphor. Successful phosphor materials include materials such as $Eu^{2+}$ or $Ce^{3+}$ doped (oxy)nitride compounds, for example $(Ba,Sr)_2Si_5N_8$:$Eu^{2+}$ and $(Ca,Sr)AlSiN_3$:$Eu^{2+}$. However, these phosphors have drawbacks when used in certain applications since their emission spectra are broad (full-width at half maximum is approximately 75-85 nm) and a large part of the spectrum is beyond 650 nm in wavelength—a part of the spectrum to which human eyes are insensitive—which significantly reduces the lumen efficacy of LED lighting. $MSe_{1-x}S_x$:Eu materials show red color emission from 600 to 650 nm, and provide high lumen efficacy of LED lighting after combining with yellow or green phosphors. However, the narrow band red phosphors with general composition $MSe_{1-x}S_x$:Eu are hygroscopic, and exhibit rapid deterioration of photoluminescence due to exposure to moisture (water vapor), oxygen and/or heat. Clearly there is a need for narrow band red phosphors with general composition $MSe_{1-x}S_x$:Eu, with coatings which are effective at protecting the phosphor particles from moisture and oxygen and enable a commercially useful phosphor.

SUMMARY OF THE INVENTION

A coated phosphor may in some embodiments comprise: phosphor particles, wherein the phosphor particles are comprised of a phosphor with composition $MSe_{1-x}S_x$:Eu, wherein M is at least one of Mg, Ca, Sr, Ba and Zn and $0<x<1.0$; and a coating on individual ones of the phosphor particles, the coating comprising a layer of oxide material encapsulating the individual phosphor particles; wherein the coated phosphor is configured such that under excitation by a blue LED the reduction in photoluminescent intensity at the peak emission wavelength after 1,000 hours of aging at about 85° C. and about 85% relative humidity (RH) is no greater than about 15%; and wherein the coated phosphor is configured such that the change in chromaticity coordinates CIE(x), Δx, after 1,000 hours of aging at about 85° C. and about 85% relative humidity is less than or equal to about $10 \times 10^{-3}$.

In some embodiments, a coated phosphor may comprise: phosphor particles, wherein the phosphor particles are comprised of a phosphor with composition $MSe_{1-x}S_x$:Eu, wherein M is at least one of Mg, Ca, Sr, Ba and Zn and $0<x<1.0$; and a coating on individual ones of the phosphor particles, comprising a layer of oxide material encapsulating the individual phosphor particles; wherein the coated phosphor is configured such that the coated phosphor does not turn black when suspended in a 1 mol/L silver nitrate solution for at least 5 days at 20° C. In embodiments, the coated phosphor is configured such that the coated phosphor does not turn black when suspended in a 1 mol/L silver nitrate solution for at least 2 hours at 85° C.

In some embodiments, a method of forming a coated phosphor may comprise: providing phosphor particles, wherein the phosphor particles are comprised of a phosphor with composition $MSe_{1-x}S_x$:Eu, wherein M is at least one of Mg, Ca, Sr, Ba and Zn and $0<x<1.0$; and depositing a coating on individual ones of the phosphor particles by a gas phase process in a fluidized bed reactor, the coating comprising a layer of oxide material encapsulating the individual phosphor particles; wherein the coated phosphor is configured to satisfy one or more of the conditions: (1) such that under excitation by a blue LED the reduction in photoluminescent intensity at the peak emission wavelength after 1,000 hours of aging at about 85° C. and about 85% relative humidity is no greater than about 15%; (2) such that the change in chromaticity coordinates CIE(x), Δx, after 1,000 hours of aging at about 85° C. and about 85% relative humidity is less than or equal to about $10 \times 10^{-3}$; and (3) wherein the coated phosphor is configured such that the coated phosphor does not turn black when suspended in a 1 mol/L silver nitrate solution for at least 2 hours at 85° C.

In some embodiments, a white light emitting device comprising: an excitation source with emission wavelength within a range from 200 nm to 480 nm; a coated phosphor according to any of the embodiments described herein, with a first phosphor peak emission wavelength; and a second phosphor with a second phosphor peak emission wavelength different to said first phosphor peak wavelength.

In some embodiments, a white light emission device for backlighting, comprising: an excitation source with emission wavelength within a range from 440 nm to 480 nm; a coated phosphor according to any of the embodiments described herein, with a first phosphor peak emission wavelength between about 625 nm and about 645 nm; and a second phosphor with a second phosphor peak emission wavelength different to said first phosphor peak wavelength, said second phosphor peak emission wavelength being between about 520 nm and about 545 nm; wherein said white light emission device has an emission spectrum with clearly separated blue, green and red peaks, and a color gamut after liquid crystal display (LCD) red, green and blue (RGB) color filters of at least 85% of the NTSC (National Television System Committee) standard.

In some embodiments, a white light emission device may comprise: an excitation source with emission wavelength within a range from 200 nm to 480 nm; and a remote phosphor component comprising green-yellow phosphors with a peak emission wavelength between about 500 nm and about 600 nm and a coated phosphor according to any of the embodiments described herein with a peak emission wavelength between about 600 nm and about 650 nm.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
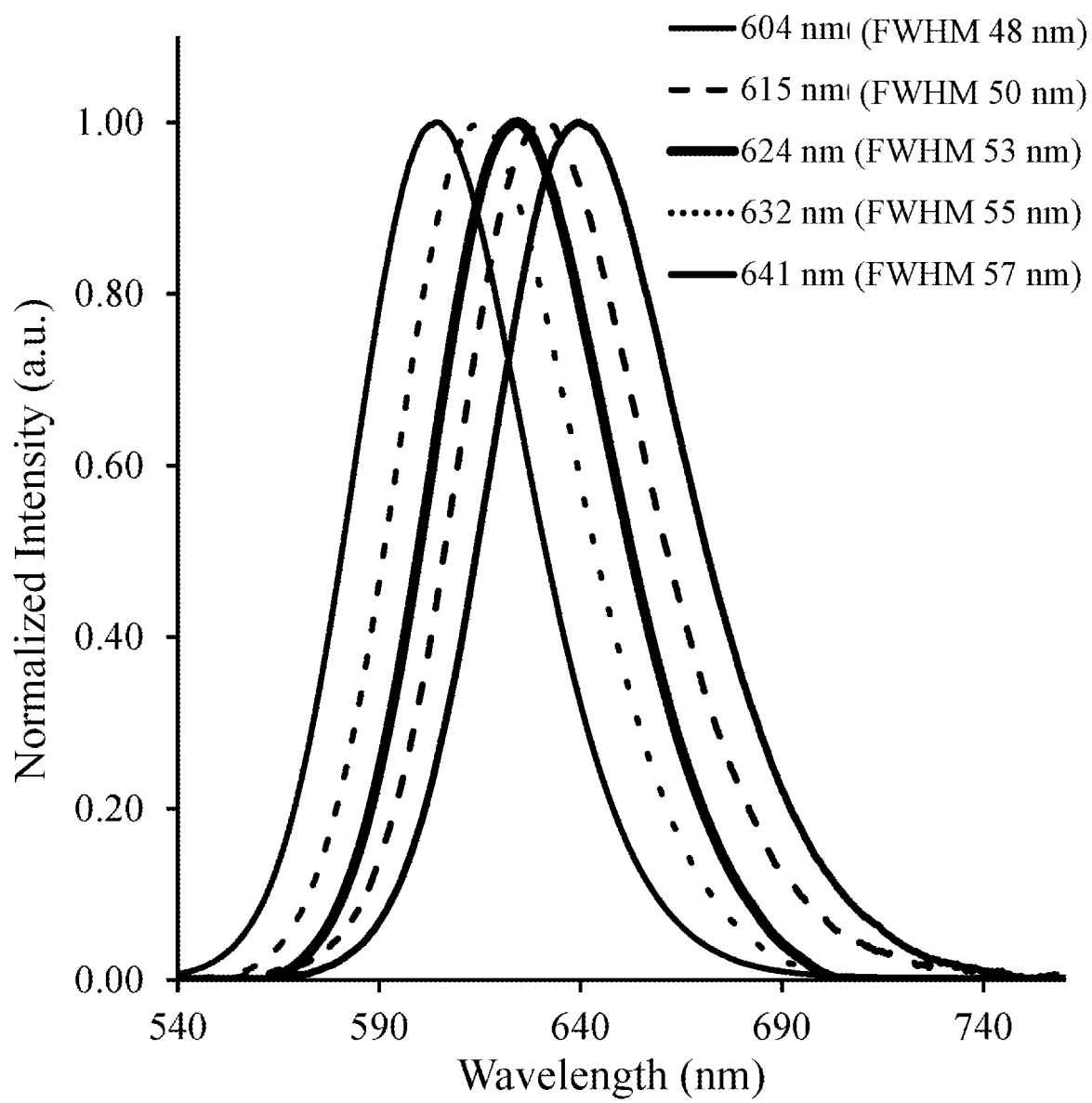
FIG. 1 shows normalized emission spectra of CSS ($CaSe_{1-x}S_x$:Eu) phosphors for differing ratios of S/Se.

FIG. 1 shows normalized emission spectra of CSS ($CaSe_{1-x}S_x$:Eu) phosphors for differing ratios of S/Se, the emission peak can be tuned from 600 nm to 650 nm by the ratio of S/Se in the composition and exhibits a narrow band red emission spectrum with full width half maximum (FWHM) typically in the range from ~48 nm to ~60 nm (longer wavelength typically has a larger FWHM value), when excited by a blue light source with a peak emission of about 450 nm. For comparison, a CASN red nitride phosphor (a calcium aluminum silicon nitride based phosphor) typically has a FWHM of ~80 nm. Note that x varies from about 0.05 to about 0.8 for the compositions shown in FIG. 1—the higher peak wavelengths corresponding to the larger values of x.

Figure 2:
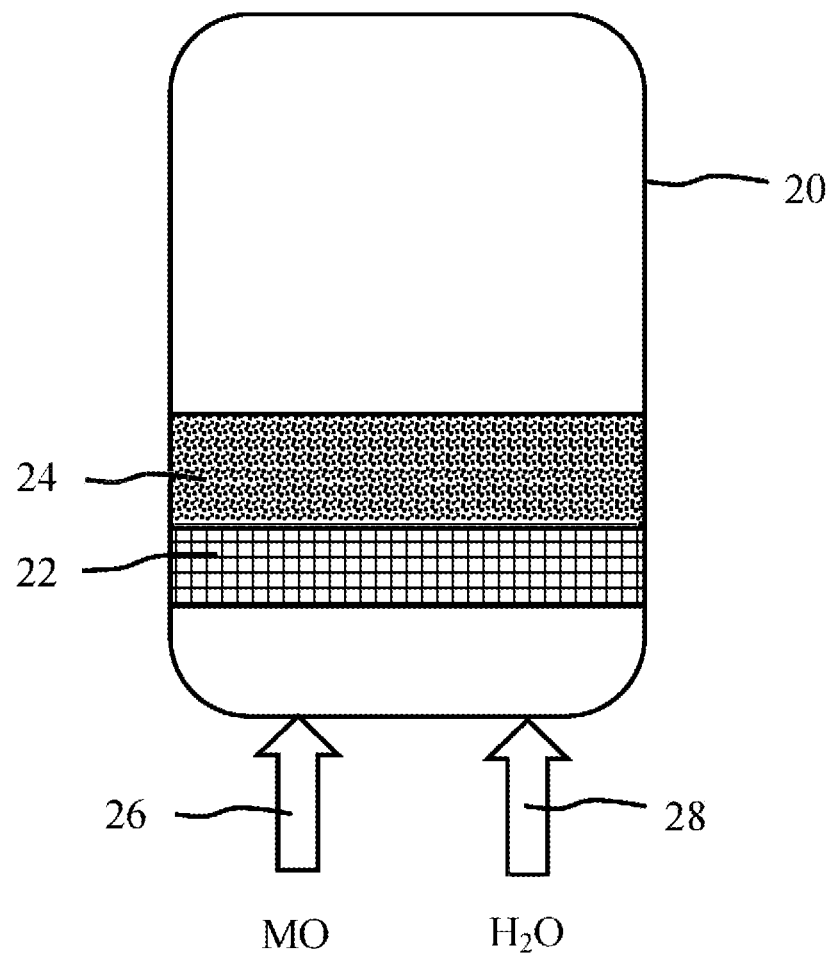
FIG. 2 is a schematic representation of a phosphor particle coating apparatus according to an embodiment of the invention.

CSS particles are synthesized from purified $CaSeO_4$ and $CaSO_4$ in a mild $H_2$ (gas) environment (for example ~5% $H_2/N_2$). Herein, unless otherwise specified, CSS phosphor samples used in the examples have a composition of $CaSe_{1-x}S_x$:Eu with x ~0.2. The particles are coated by a CVD process in a fluidized bed reactor. FIG. 2 is a schematic representation of a phosphor particle coating apparatus according to an embodiment of the invention. Reactor 20 comprises a porous support disc 22, over which phosphor powder 24 is held, and inlets 26 and 28 for metal organic precursor and water vapor, respectively. The coating materials may be one or more materials chosen from the group consisting of aluminum oxide, silicon oxide, titanium oxide, zinc oxide, magnesium oxide, zirconium oxide and chromium oxide. The thickness may typically be in the range of 100 nanometers to 5 microns, in embodiments in the range of 50 nm to 100 nm, 100 nm to 500 nm, 500 nm to 1 um, or 1 um to 2 um. Herein, unless otherwise specified, coated CSS samples used in the examples herein are coated with approximately 1 micron of alumina.

In a typical coating process, the phosphor powder sample was loaded into the reactor and heated to 100-250° C., preferably 200° C., under $N_2$ gas flow. A metal oxide precursor such as TrimethylAluminum (TMA), Titanium tetra-chloride ($TiCl_4$), Silicon tetra-chloride ($SiCl_4$), or DimethylZinc was introduced in to the reactor with a $N_2$ carrier gas through a bubbler. $H_2O$ vapor was also introduced into the reactor to react with the metal oxide precursor to form oxide coating layers on phosphor particles. Complete fluidization of the particles being coated (from gas flow optimization, etc.) without any dead space is important to ensure homogeneous coating of all phosphor particles. In a typical coating conducted at 200° C., for a 250 g phosphor particle loading of the reactor, the coating was produced with a metal oxide precursor feeding rate of 1 to 10 g/hour for 4 hours, while feeding $H_2O$ at a rate of 2 to 7 g/hour. It is shown below that these conditions can produce dense and pinhole free coatings and the present inventors expect that these conditions are required to produce dense substantially pinhole free coatings of uniform thickness, with theorized bulk density for the coatings of greater than 95% and in embodiments greater than 99%. It is expected by the present inventors that outside of: the specified feeding rate range for oxide precursor, the specified feeding rate range for $H_2O$, and/or the specified 100-250° C. temperature range, the coated phosphors will not exhibit the reliability documented herein.

The coated CSS phosphor particles were tested using an Ocean Optics USB4000 spectrometer for photoluminescence intensity (PL) and chromaticity (CIE coordinates x and y). It was found that there is no significant peak emission position or color (CIE) change after coating the CSS particles. The PL (relative photo luminance intensity) is also not reduced after coating but actually increased which results in a brightness increase compared to the uncoated sample as shown in Table 1.

TABLE 1

Typical photo-luminance property of CSS phosphor before and after coating

| Sample | PL | PE (nm) | CIE x | Brightness (%) |
|---|---|---|---|---|
| Before Coating | 100% | 614.5 | 0.646 | 100 |
| After Coating | 111% | 614.9 | 0.648 | 103.3 |

Figure 3A:
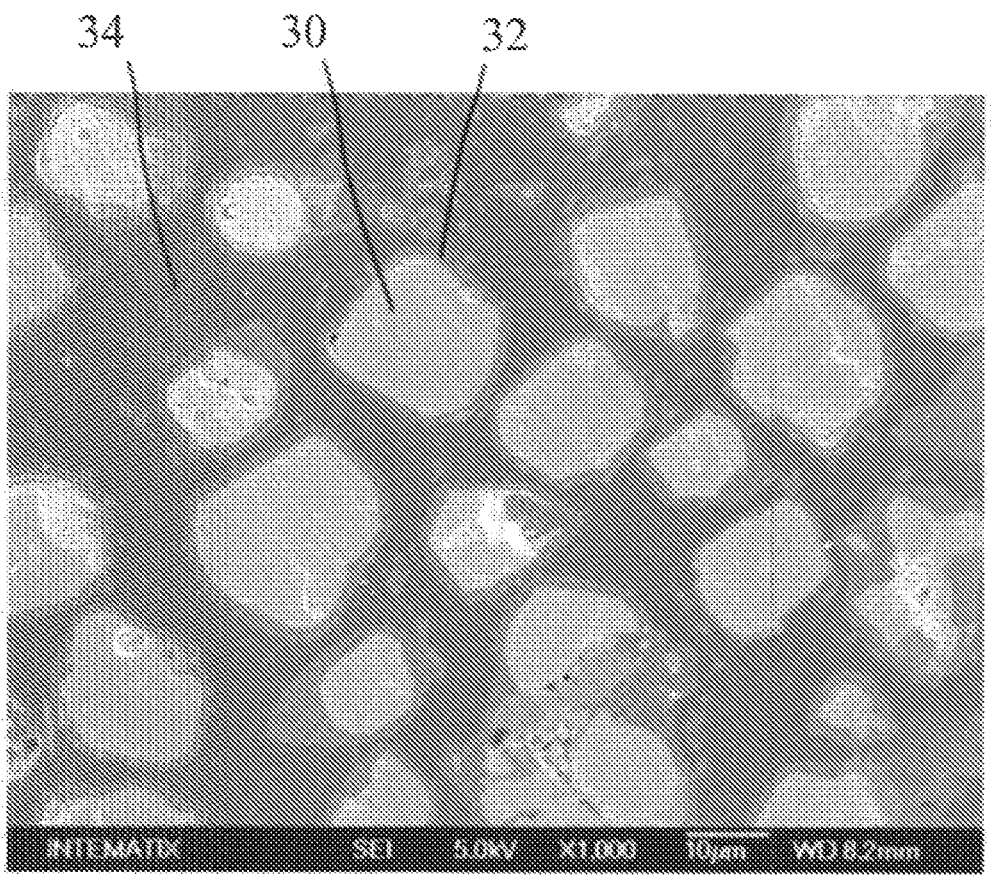
FIGS. 3A and 3B are SEM micrographs of coated CSS phosphor particles according to an embodiment of the invention.
Figure 3B:
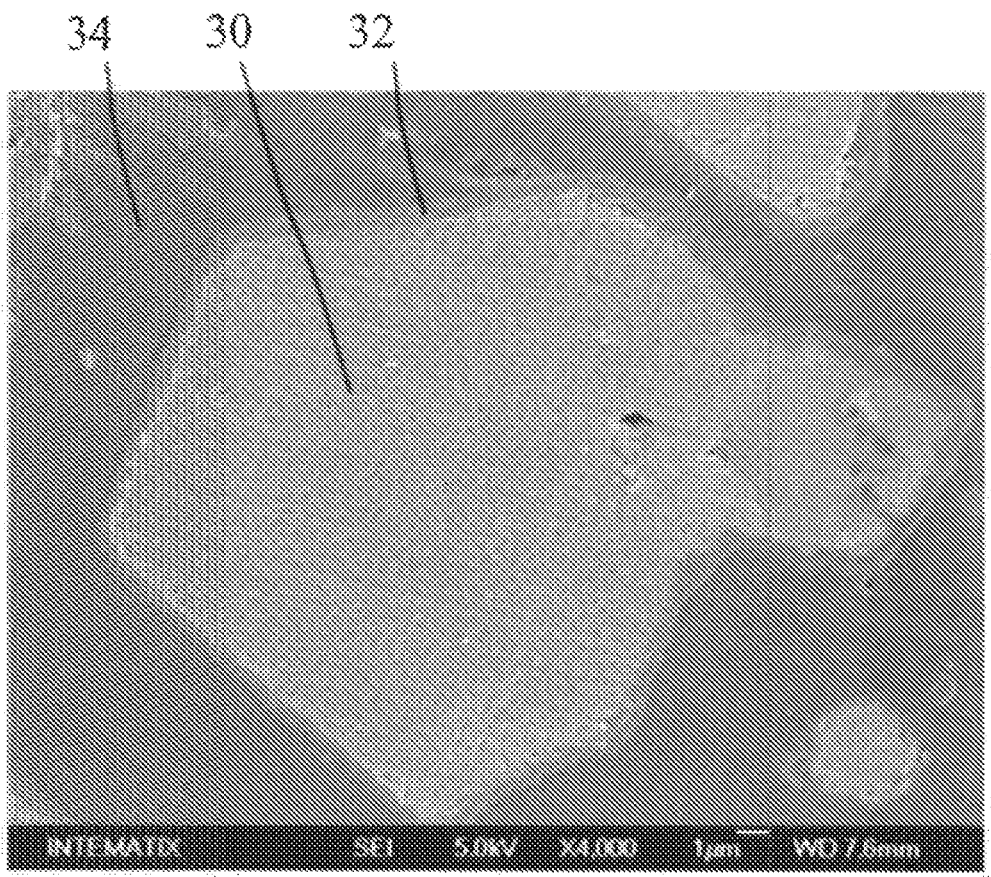

FIGS. 3A and 3B are SEM micrographs of coated CSS phosphor particles according to an embodiment of the invention; the sample shows CSS particles 30, with coating 32, embedded in epoxy 34. The samples were prepared by dispersing the phosphor particles in epoxy then curing. After curing, the epoxy (with CSS powder) was polished and then covered by a flash of sputtered Pd—Au metal to enhance the sample's electronic conductivity (the metal reduces/removes electron charging when analyzing the sample in the SEM). The prepared cross section sample was then analyzed by scanning electron microscopy (SEM) which clearly showed the hermetic coating layer of alumina around the CSS particles (complete coverage by coating layer of particle without observable gaps or pinholes), as shown in FIGS. 3A & 3B. Diameters of the phosphor particles are in a range between 5 microns and 20 microns.

Figure 4A:
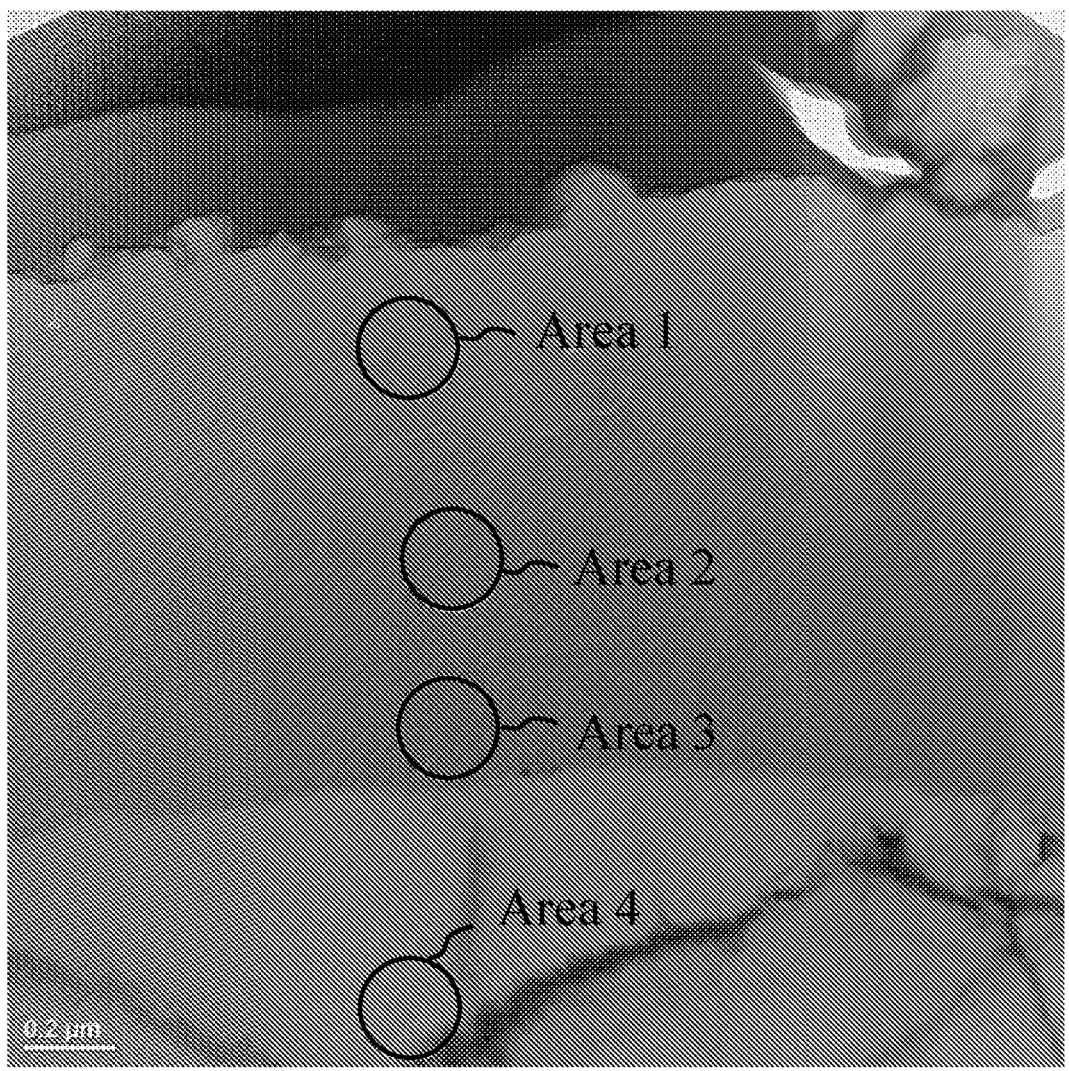
FIG. 4A is a TEM micrograph of a portion of a coated CSS phosphor particle according to some embodiments.
Figure 4B:
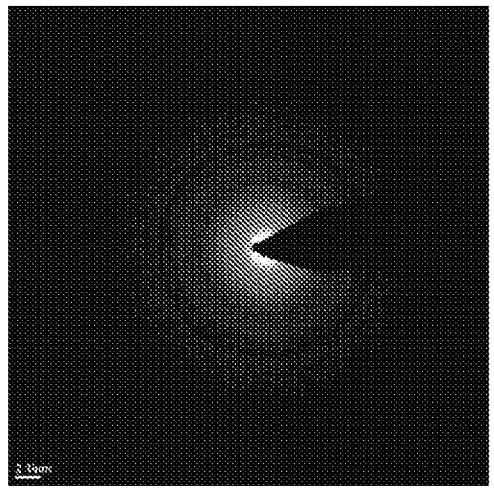
FIGS. 4B-4E are electron diffraction patterns for various regions of FIG. 4A denoted Areas 1-4.
Figure 4C:
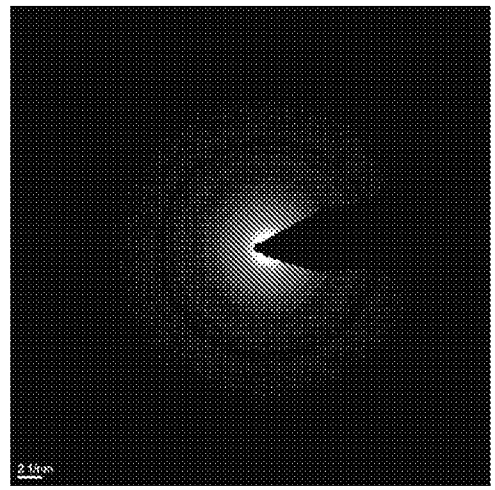
Figure 4D:
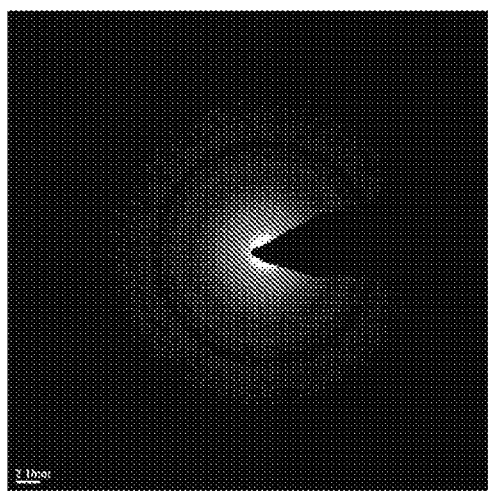
Figure 4E:
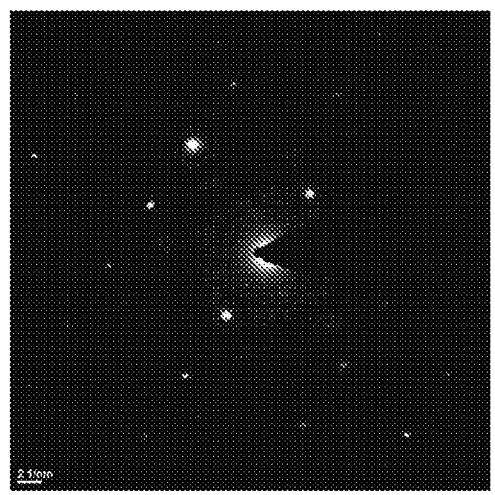

FIG. 4A is a TEM micrograph of a portion of a coated CSS phosphor particle according to some embodiments; a thin section sample of the coated CSS phosphor particles was also analyzed in a TEM to reveal the fine structure of the coating layer which showed a dense amorphous oxide coating layer on the CSS particle surface without pinholes. FIGS. 4B-4E are electron diffraction patterns for various regions of FIG. 4A denoted as Areas 1 through 4, showing the amorphous structure of the coating (Areas 1-3) and the crystalline structure of the CSS particle (Area 4).

The stability and reliability of the coated CSS phosphor particles may be established using a silver test, as follows. Silver ions ($Ag^+$) can attack S/Se in CSS to form a black $Ag_2S/Ag_2Se$ compound if the CSS surface is not well protected (for example, if pinholes are present in the coating black $Ag_2S/Ag_2Se$ spots would form). The silver test is based on this mechanism and involves soaking the coated CSS materials in $AgNO_3$ solution to evaluate how well the coating layer is able to protect the CSS phosphor particle against $Ag^+$ attack. The longer the time the CSS can survive in the Ag test, the better the surface protection (coating/reliability) the phosphor should have.

In a Ag test, CSS powder was soaked in 1 mol/L $AgNO_3$ solution, and the stability of the sample was evaluated by monitoring how long the powder can survive without turning black. For comparison, it is noted that uncoated CSS samples turn black in as little as 1 minute. Test results show that a well coated sample can survive without blackening for more than 30 days.

Figure 5:
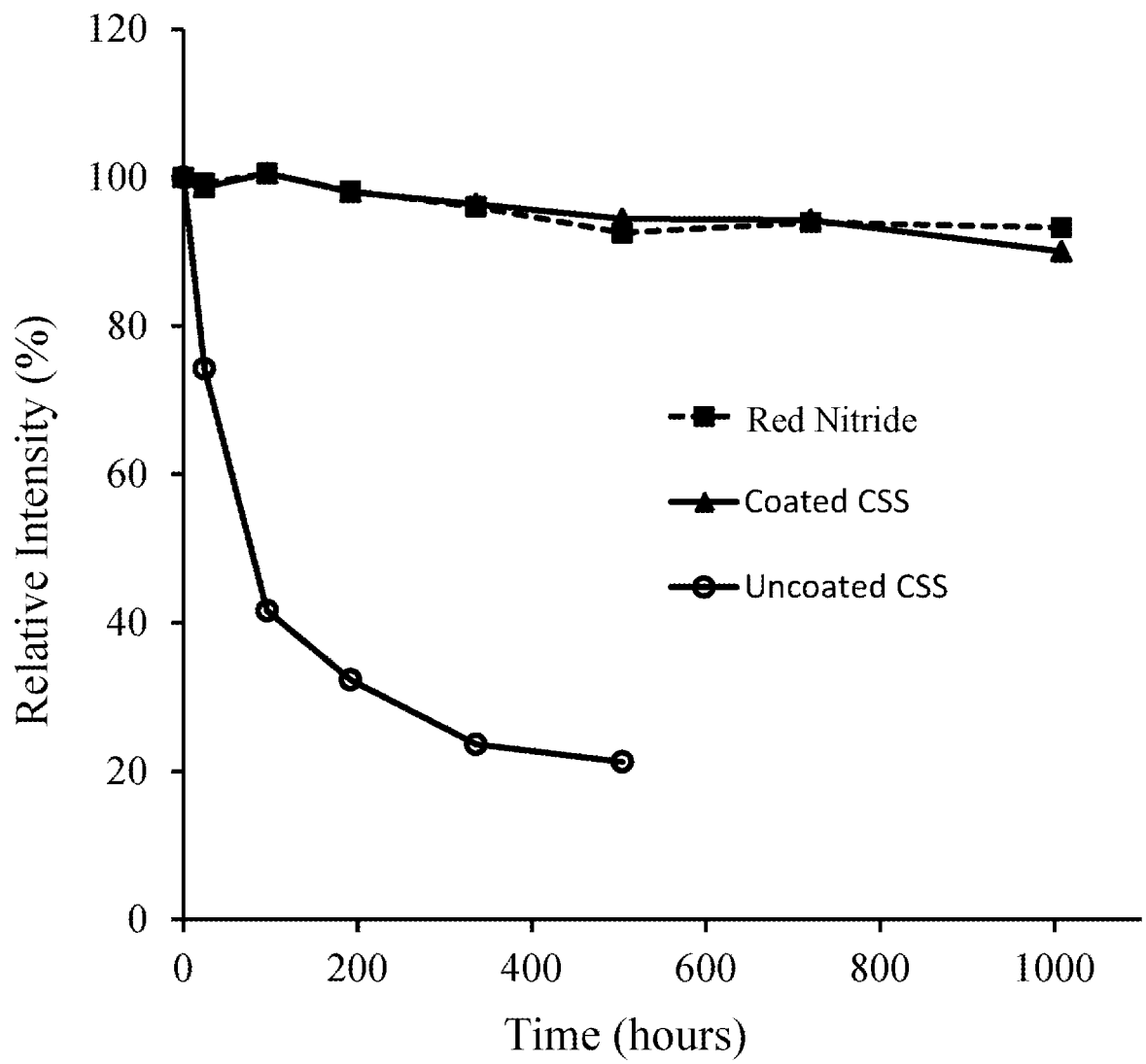
FIG. 5 shows reliability data, relative photoluminescence intensity versus time, for an LED operated under accelerated testing conditions 85° C./85% RH for i) uncoated CSS, ii) coated CSS according to an embodiment of the invention and iii) red nitride phosphors.
Figure 6:
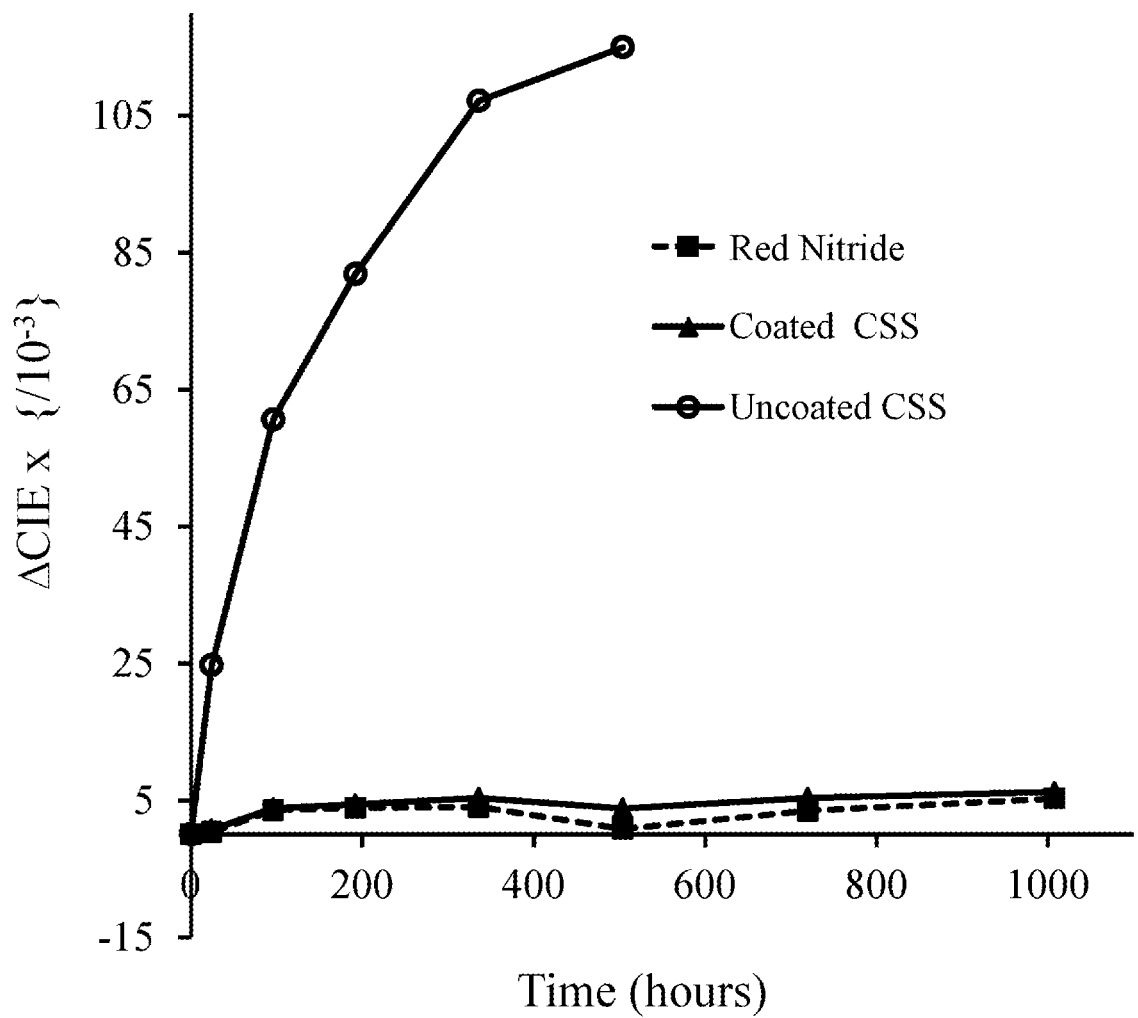
FIG. 6 shows reliability data, change of chromaticity Δ CIE x versus time, for an LED operated under accelerated testing conditions 85° C./85% RH for i) uncoated CSS, ii) coated CSS according to an embodiment of the invention and iii) red nitride phosphors.

FIG. 5 shows reliability data, relative photoluminescence intensity versus time, for an LED operated under accelerated testing conditions 85° C./85% RH for i) uncoated CSS, ii) coated CSS according to an embodiment of the invention and iii) red nitride phosphors. The LED package with uncoated CSS phosphor failed within ~48 hours under 350 mA at 85° C./85% RH—the brightness dropped ~25% in 24 hours and dropped 60% after 100 h. FIG. 6 shows reliability data, change of chromaticity Δ CIE x versus time, for an LED operated under accelerated testing conditions 85° C./85% RH for i) uncoated CSS, ii) coated CSS according to an embodiment of the invention and iii) red nitride phosphors; CIE x changed 0.06 after 100 hours for the uncoated CSS. CSS with optimized coating according to embodiments passed 1000 hours 85° C./85% RH reliability test with brightness drop of less than 10% and CIE x change within 0.005, with a similar performance to the red nitride (CASN) reference.

Figure 7:
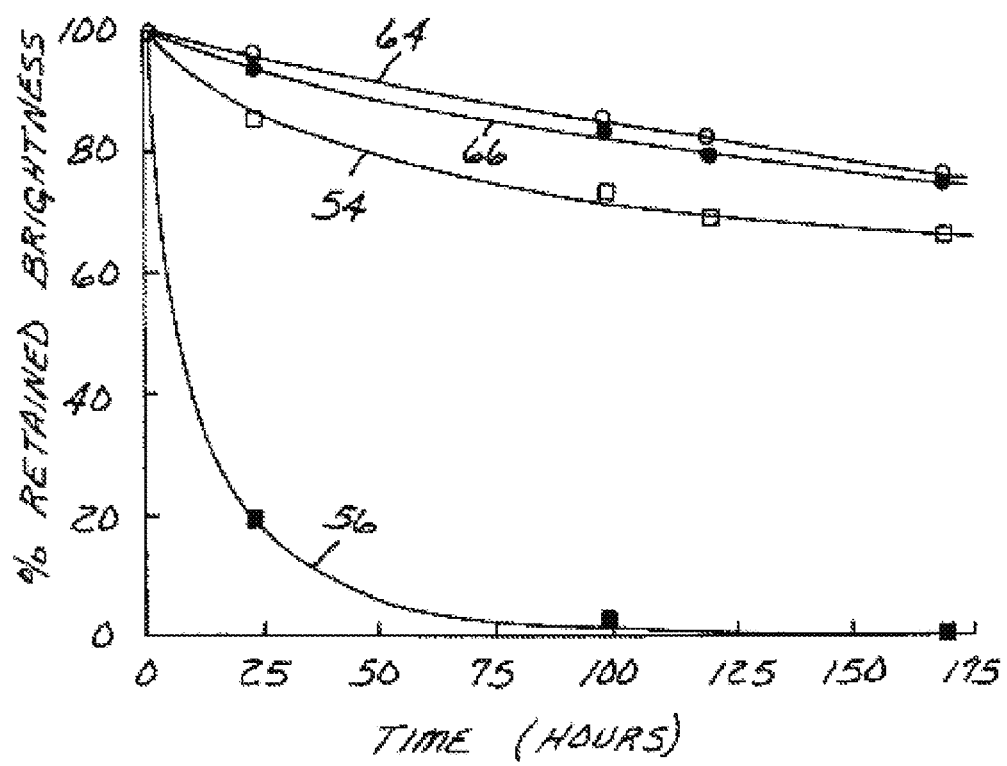
FIG. 7 shows % retained brightness versus time for a coated prior art ZnS phosphor.

FIG. 7 shows % retained brightness versus time for a prior art coated ZnS phosphor—FIG. 4 from U.S. Pat. No. 5,418,062—which had lost 20% brightness in 175 hours at room temperature. In FIG. 7, 56 is an uncoated phosphor tested in a dry environment, 54 is an uncoated phosphor tested in a >95% RH environment, 66 is a coated phosphor tested in a >95% RH environment, and 64 is a coated phosphor tested in a dry environment. The coating process of the '062 patent is not as effective as the coating process of the present invention.

Figure 8:
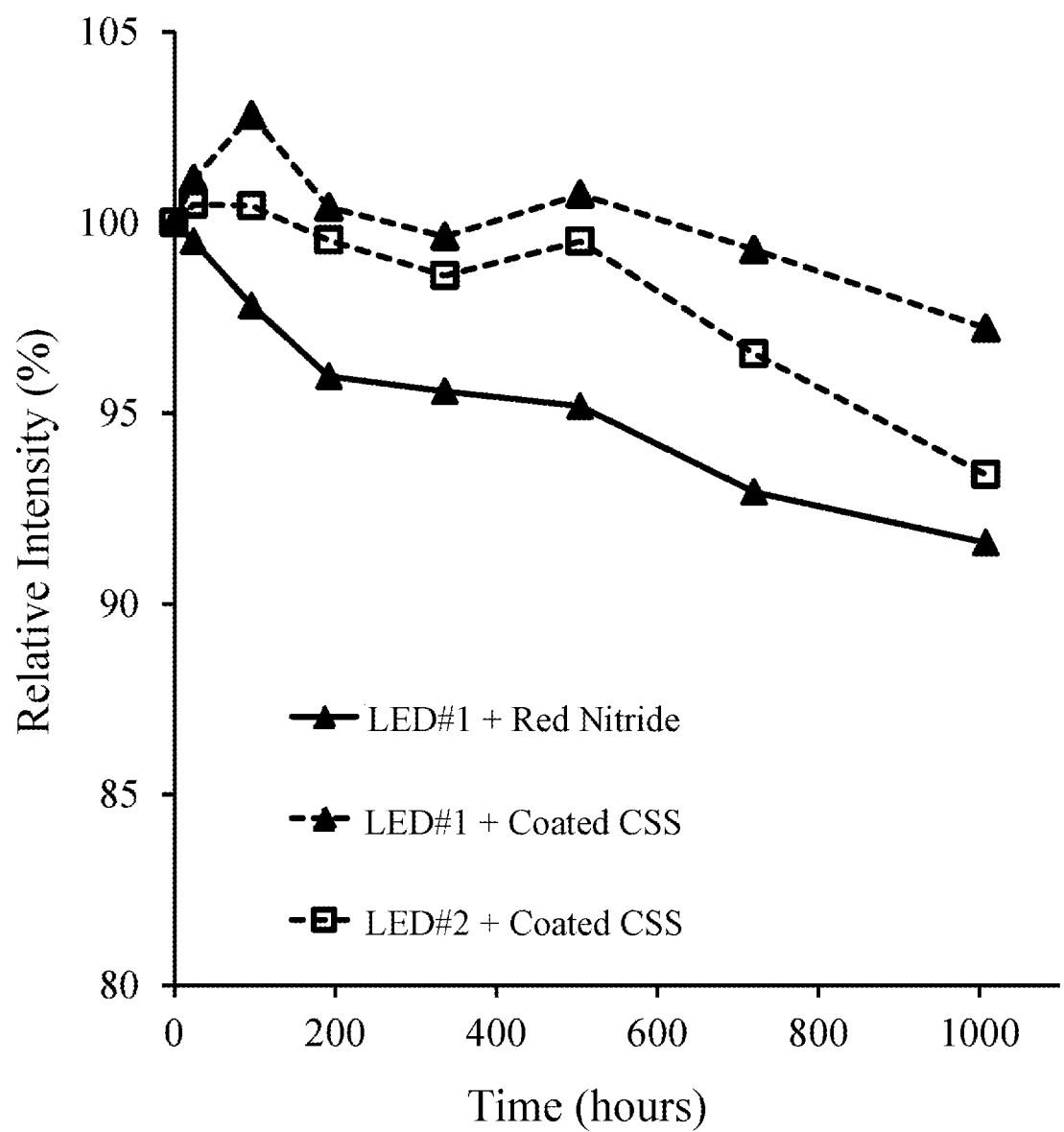
FIG. 8 shows reliability data, relative photoluminescence intensity versus time, for an LED operated under accelerated testing conditions 85° C./85% RH for (i) a first blue LED#1 combined with a red nitride phosphor, (ii) a first blue LED#1 combined with coated CSS phosphor according to some embodiments and (iii) a second blue LED#2 combined with coated CSS phosphor according to some embodiments.
Figure 9:
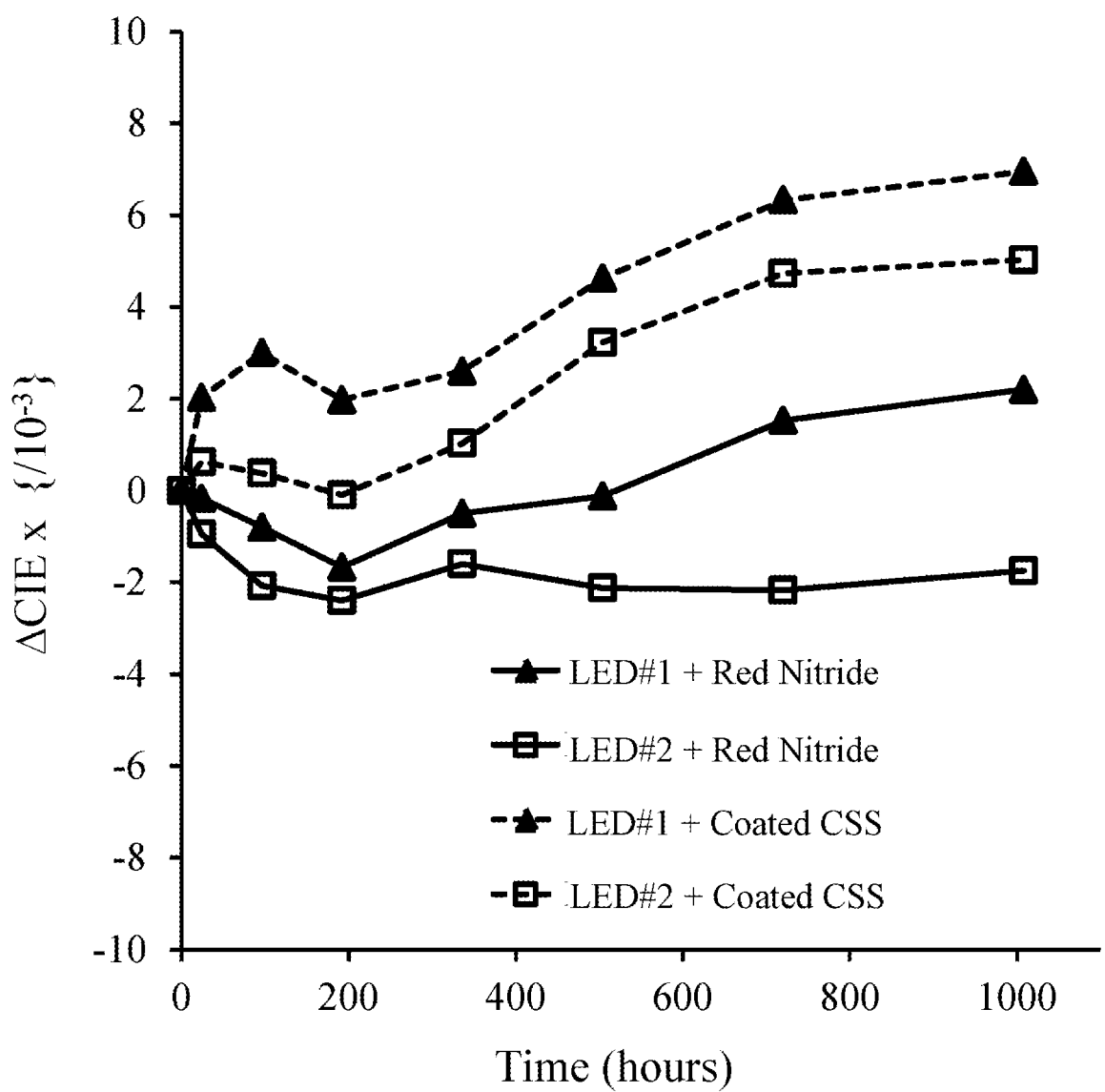
FIG. 9 shows reliability data, change of chromaticity Δ CIE x versus time, for an LED operated under accelerated testing conditions 85° C./85% RH for (i) a first blue LED#1 combined with a red nitride phosphor, (ii) a second blue LED#2 combined with a red nitride phosphor, (iii) a first blue LED#1 combined with coated CSS phosphor according to some embodiments and (iv) a second blue LED#2 combined with coated CSS phosphor according to some embodiments.

The problem for sulfide materials used to coat LEDs that have Ag-coated lead frame is that the sulfide in the phosphor may react with the silver. To evaluate this potential problem, coated CSS phosphor of the present invention were tested on two different LEDs with Ag-coated lead frames. (LED#1 is a Lextar 3030 LED—3.0 mm×3.0 mm lead frame package with silver electrodes. LED#2 is a Jufei 7020 LED—7.0 mm×2.0 mm lead frame package with silver electrodes.) FIGS. 8 & 9 show the coated CSS has the same stable reliability performance as a red nitride (CASN) reference, and it clearly demonstrates the hermetic encapsulation of the coated CSS phosphor of the present invention. FIG. 8 shows reliability data, relative photoluminescence intensity versus time, for an LED operated under accelerated testing conditions 85° C./85% RH for (i) a first blue LED#1 combined with a red nitride phosphor, (ii) a first blue LED#1 combined with coated CSS phosphor according to some embodiments and (iii) a second blue LED#2 combined with coated CSS phosphor according to some embodiments. FIG. 9 shows reliability data, change of chromaticity Δ CIE x versus time, for an LED operated under accelerated testing conditions 85° C./85% RH for (i) a first blue LED#1 combined with a red nitride phosphor, (ii) a second blue LED#2 combined with a red nitride phosphor, (iii) a first blue LED#1 combined with coated CSS phosphor according to some embodiments and (iv) a second blue LED#2 combined with coated CSS phosphor according to some embodiments.

Figure 10:
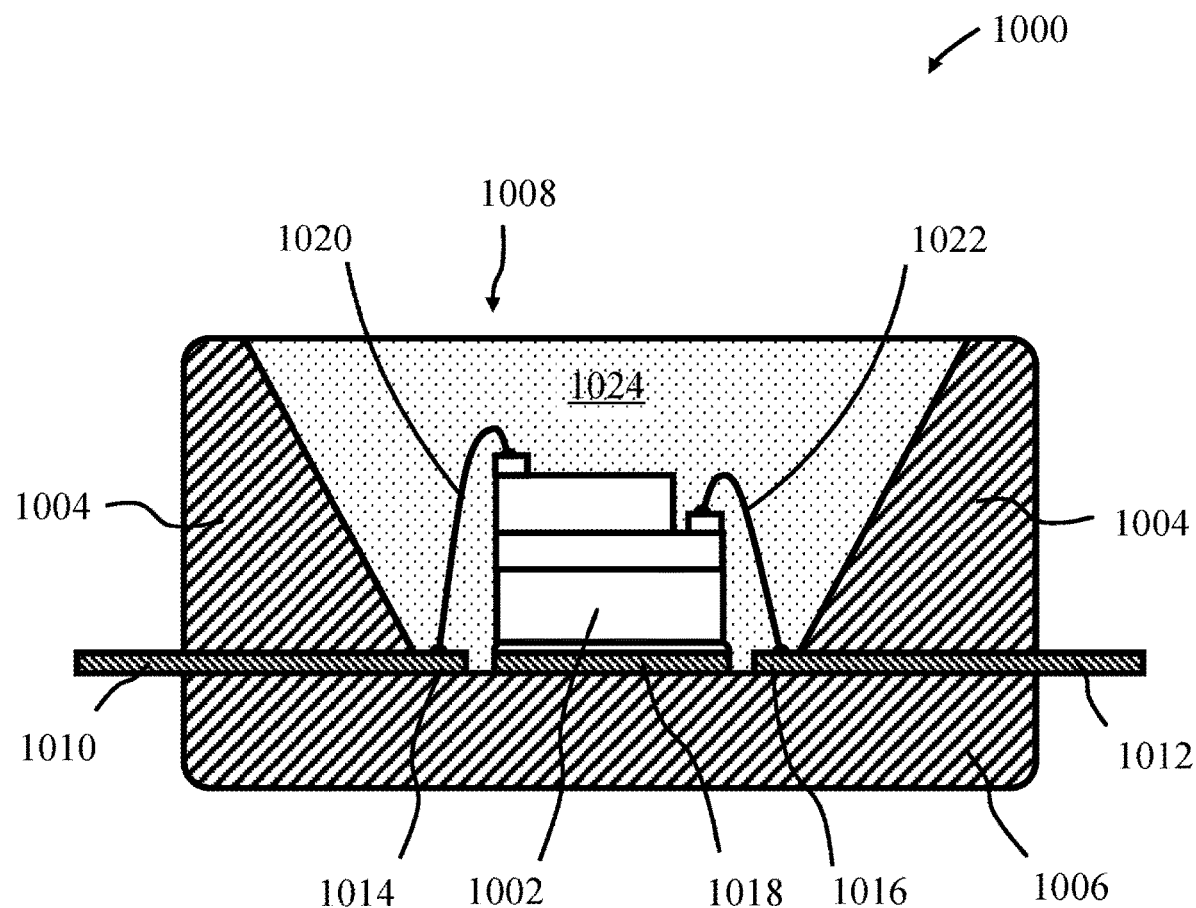
FIG. 10 is a schematic representation of shows a white light emitting device, according to some embodiments.

Packaged White Light Emitting Device, for Display Backlight and General Lighting Device FIG. 10 illustrates a white light emitting device, according to some embodiments. The device 1000 can comprise a blue light emitting, within the range of 450 nm to 470 nm, GaN (gallium nitride) LED chip 1002 for example, housed within a package. The package, which can for example comprise a low temperature co-fired ceramic (LTCC) or high temperature polymer, comprises upper and lower body parts 1004, 1006. The upper body part 1004 defines a recess 1008, often circular in shape, which is configured to receive the LED chips 1002. The package further comprises electrical connectors 1010 and 1012 that also define corresponding electrode contact pads 1014 and 1016 on the floor of the recess 1008. Using adhesive or solder, the LED chip 1002 can be mounted to a thermally conductive pad 1018 located on the floor of the recess 1008. The LED chip's electrode pads are electrically connected to corresponding electrode contact pads 1014 and 1016 on the floor of the package using bond wires 1020 and 1022 and the recess 1008 is completely filled with a transparent polymer material 1024, typically a silicone, which is loaded with a mixture of a red emitting phosphor material of the present invention and a second phosphor with a second phosphor peak emission wavelength different from the red emitting phosphor peak wavelength such that the exposed surfaces of the LED chip 1002 are covered by the phosphor/polymer material mixture. To enhance the emission brightness of the device the walls of the recess are inclined and have a light reflective surface. In some embodiments, the second phosphor is a green emitting phosphor, and in other embodiments the second phosphor is a green or yellow-emitting phosphor having a peak emission wavelength between about 515 nm and about 570 nm.

Due to its narrow band emission spectrum, CSS phosphor shows better brightness performance than CASN red nitride phosphor. Table 2 shows for 2700K 90CRI, that CSS is 18.6% brighter than CASN red nitride with CRI over 90; the white LED spectrum for the two phosphors is shown for comparison in FIG. 11.

TABLE 2

| | CSS phosphor + green phosphor (535 nm) for 2700K 90 CRI lighting | | | | | | |
|---|---|---|---|---|---|---|---|
| Sample | Flux (lm) | Brightness | CIE x | CIE y | CCT | CRI | R9 |
| CASN red nitride (~645 nm) | 7.240 | 100.0% | 0.4600 | 0.4104 | 2697K | 91.0 | 56.5 |
| CSS (~625 nm) | 8.590 | 118.6% | 0.4599 | 0.4107 | 2700K | 90.4 | 27.5 |

Figure 11:
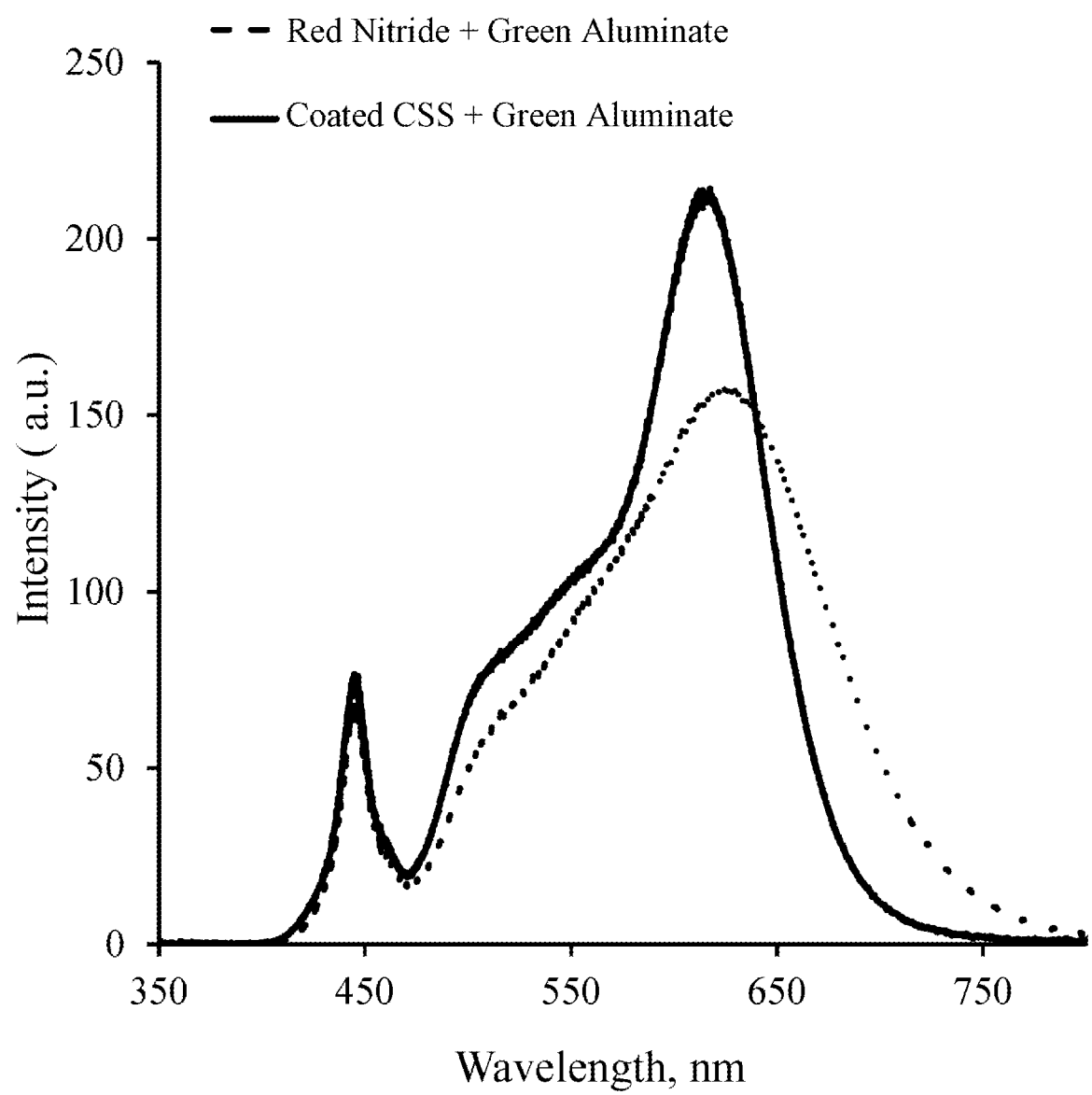
FIG. 11 white light emission spectra of a blue LED combined with (i) a red nitride phosphor and a green aluminate phosphor and (ii) a coated CSS phosphor and a green aluminate phosphor, according to some embodiments.

FIG. 11 shows white light emission spectra of a blue LED combined with (i) a red nitride phosphor and a green aluminate phosphor and (ii) a coated CSS phosphor and a green aluminate phosphor, according to some embodiments. The green phosphor is an aluminate phosphor, GAL535, available from Intematix Corp.

Figure 12:
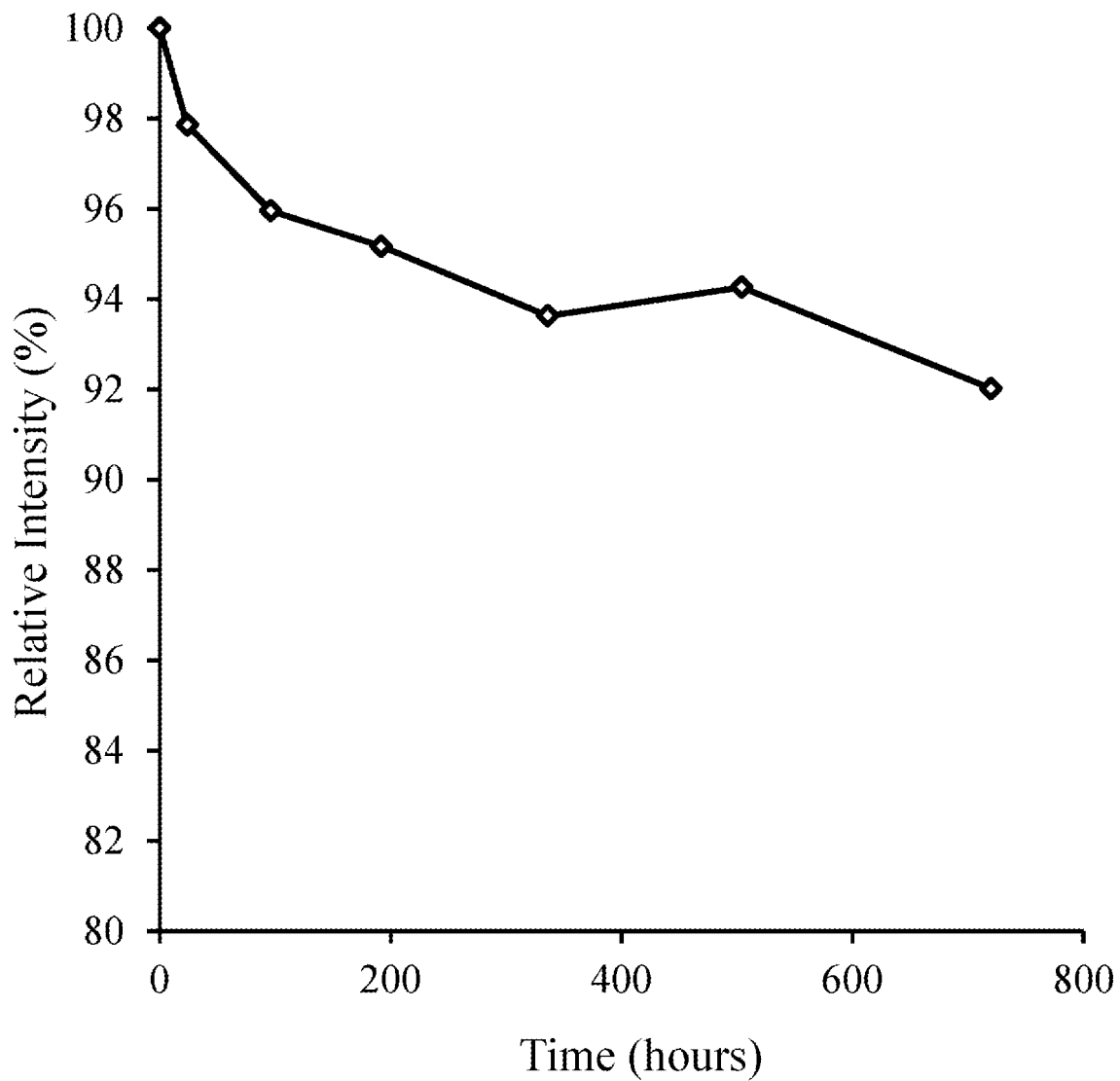
FIG. 12 shows reliability data, relative photoluminescence intensity versus time, for a white light emitting device operated under accelerated testing conditions 85° C./85% RH for a blue LED combined with a coated CSS phosphor and a green aluminate phosphor, according to some embodiments.
Figure 13:
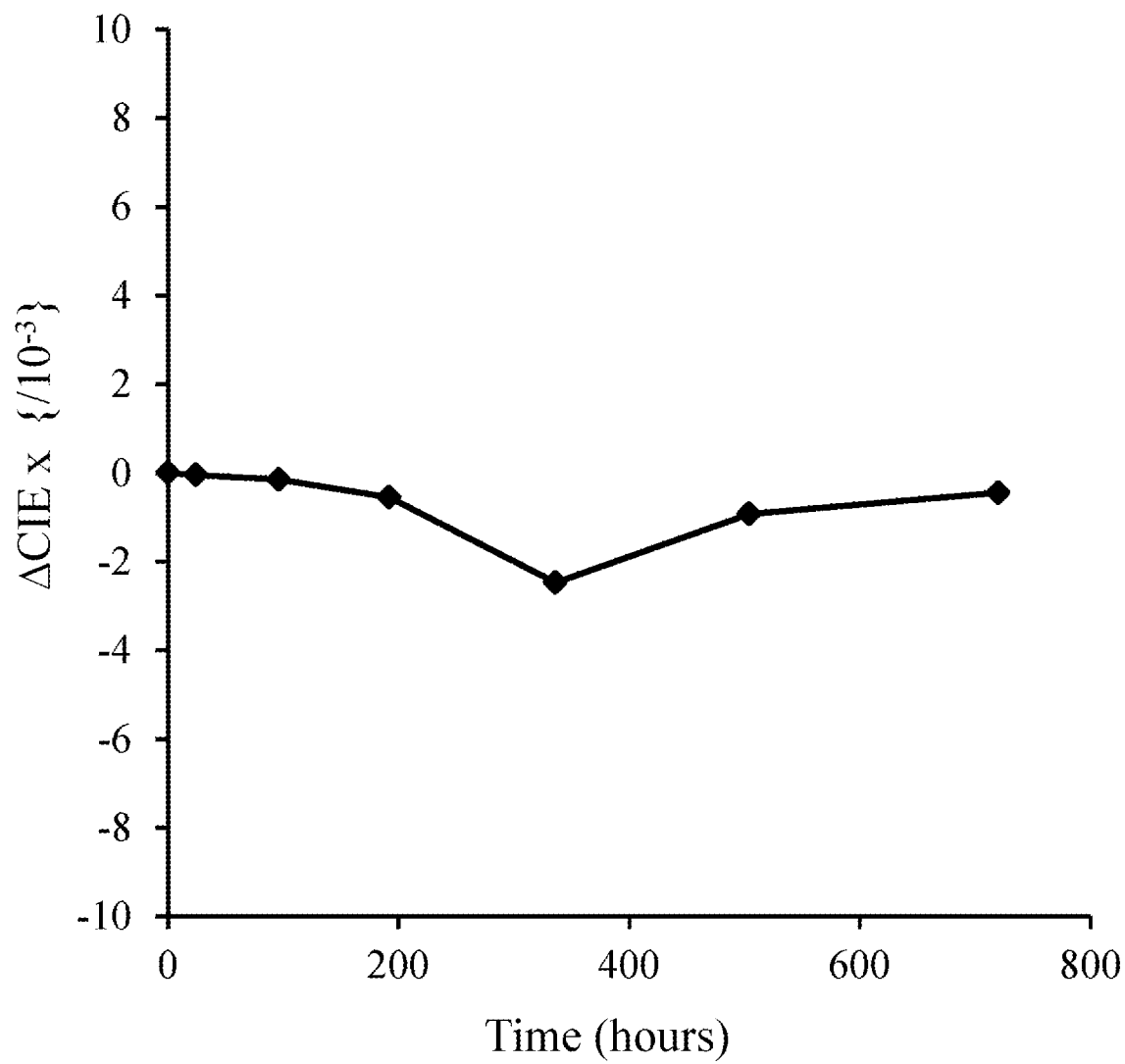
FIG. 13 shows reliability data, change of chromaticity Δ CIE x versus time, for a white light emitting device operated under accelerated testing conditions 85° C./85% RH for a blue LED combined with a coated CSS phosphor and a green aluminate phosphor, according to some embodiments.

Coated CSS of the present invention was blended with green aluminate phosphor (GAL535) to achieve warm white (CCT 3000K) luminance in a ceramic high power LED package. The package was tested at 350 mA, 85° C./85% RH for life reliability. FIG. 12 shows reliability data, relative photoluminescence intensity versus time, for a white light emitting device operated under accelerated testing conditions 85° C./85% RH for a blue LED combined with a coated CSS phosphor and a green aluminate phosphor, according to some embodiments. FIG. 13 shows reliability data, change of chromaticity Δ CIE x versus time, for a white light emitting device operated under accelerated testing conditions 85° C./85% RH for a blue LED combined with a coated CSS phosphor and a green aluminate phosphor, according to some embodiments. The figures show the brightness and CIE of the white LED package are very stable—showing almost no change during the reliability test.

Remote Phosphor White Light Emitting Device

Figure 14A:
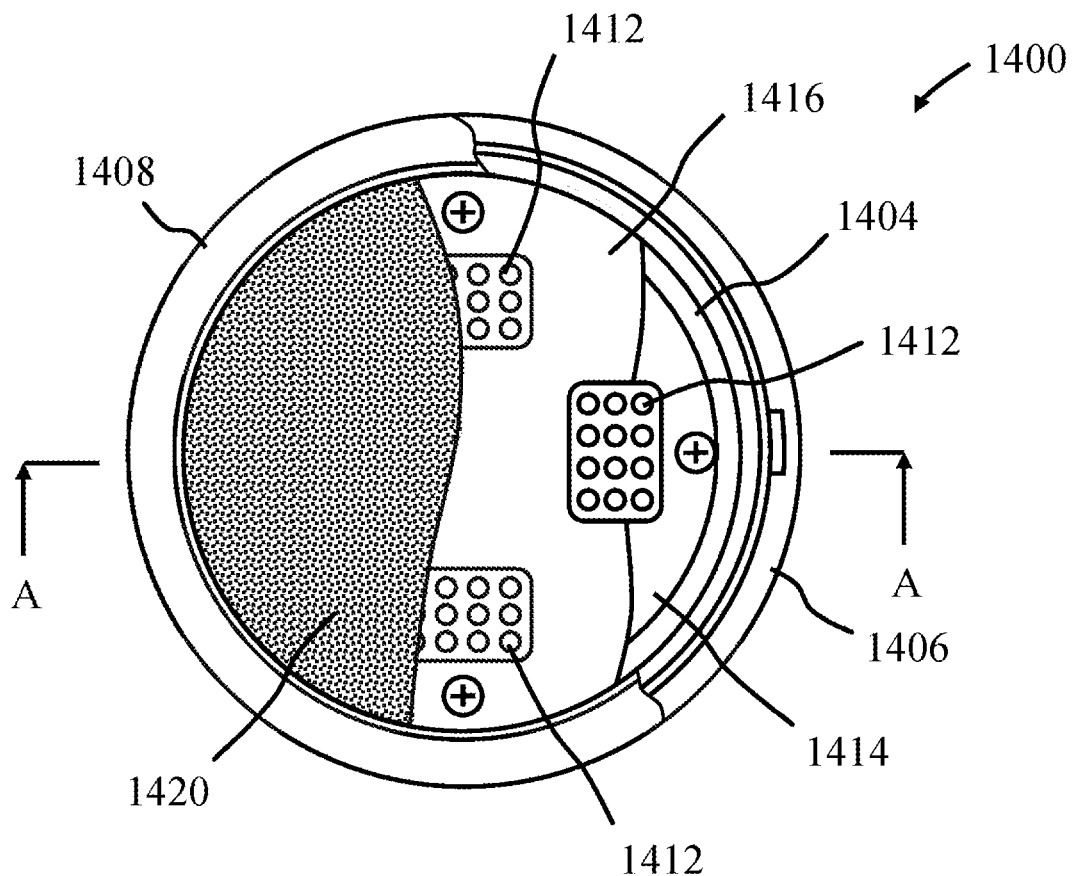
FIGS. 14A & 14B show a white light remote phosphor solid-state light emitting device, according to some embodiments.
Figure 14B:
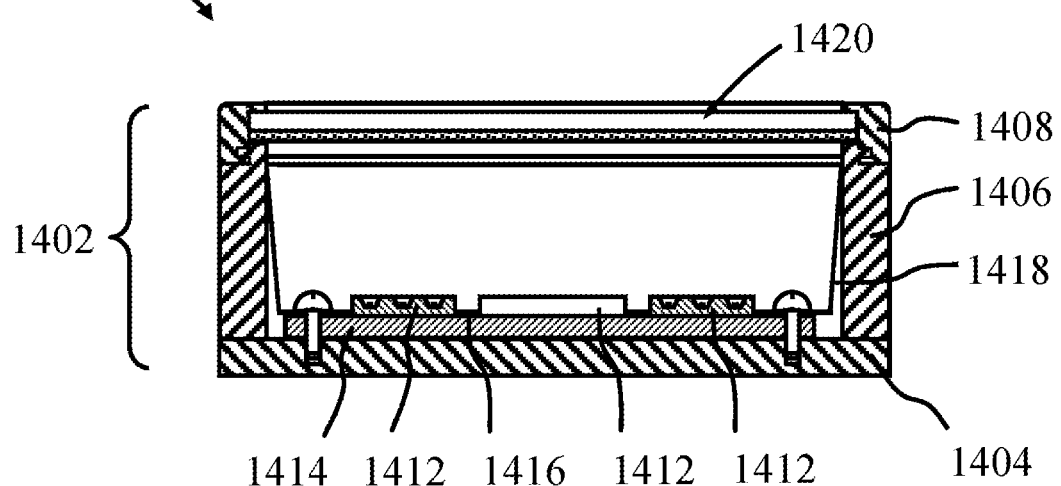

FIGS. 14A and 14B illustrate a remote phosphor solid-state white light emitting device, according to some embodiments. The device 1400 is configured to generate warm white light with a CCT (Correlated Color Temperature) of 2700K and a CRI (Color Rendering Index) of about 90. The device can be used as a part of a downlight or other lighting fixture. The device 1400 comprises a hollow cylindrical body 1402 composed of a circular disc-shaped base 1404, a hollow cylindrical wall portion 1406 and a detachable annular top 1408. To aid in the dissipation of heat, the base 1404 is preferably fabricated from aluminum, an alloy of aluminum or any material with a high thermal conductivity. The base 1404 can be attached to the wall portion 1406 by screws or bolts or by other fasteners or by means of an adhesive.

The device 1400 further comprises a plurality (four in the example illustrated) of blue light emitting LEDs 1412 (blue LEDs) that are mounted in thermal communication with a circular-shaped MCPCB (metal core printed circuit board) 1414. The blue LEDs 1412 can comprise a ceramic packaged array of twelve 0.4 W GaN-based (gallium nitride-based) blue LED chips that are configured as a rectangular array 3 rows by 4 columns. To maximize the emission of light, the device 1400 can further comprise light reflective surfaces 1416 and 1418 that respectively cover the face of the MCPCB 1414 and the inner curved surface of the top 1408.

The device 1400 further comprises a photoluminescent wavelength conversion component 1420 that is located remotely to the LEDs and operable to absorb a proportion of the blue light generated by the LEDs 1412 and convert it to light of a different wavelength by a process of photoluminescence. The emission product of the device 1400 comprises the combined light generated by the LEDs 1412 and the photoluminescent wavelength conversion component 1420. The photoluminescent wavelength conversion component may be formed of a light transmissive material (for example, polycarbonate, acrylic material, silicone material, etc.) and comprises a mixture of a yellow, red and/or green phosphor, including (coated) red phosphor material of the present invention. Furthermore, in embodiments the photoluminescent wavelength conversion component may be formed of a light transmissive material coated with phosphor material as described above, including (coated) red phosphor material of the present invention. The wavelength conversion component is positioned remotely to the LEDs 1412 and is spatially separated from the LEDs. In this patent specification "remotely" and "remote" means in a spaced or separated relationship. The wavelength conversion component 1420 is configured to completely cover the housing opening such that all light emitted by the lamp passes through the component 1420. As shown the wavelength conversion component 1420 can be detachably mounted to the top of the wall portion 1406 using the top 1408 enabling the component and emission color of the lamp to be readily changed.

Figure 15:
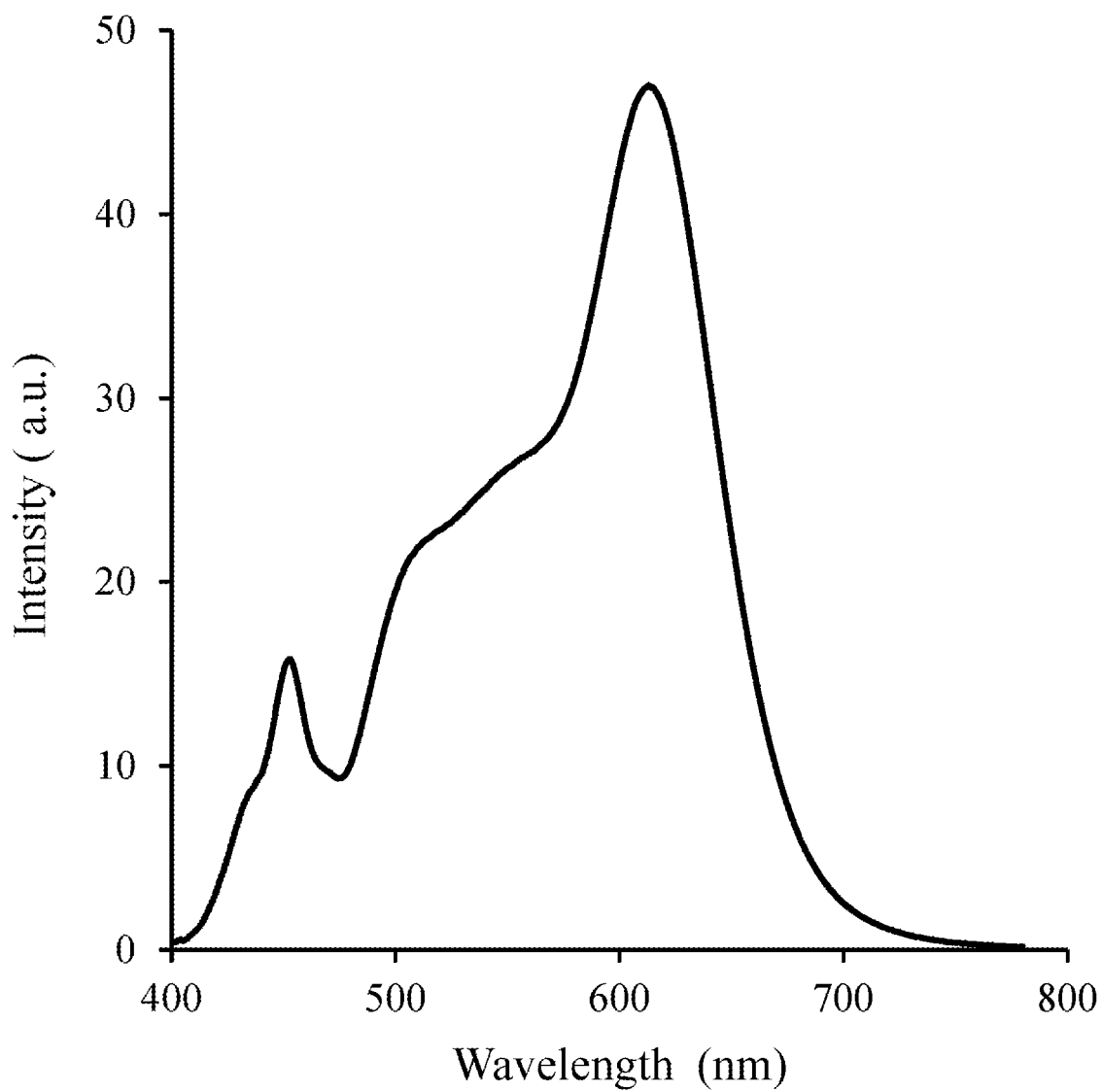
FIG. 15 white light emission spectra of a remote phosphor light emitting device with a remote phosphor wavelength conversion component comprising coated CSS phosphor and a green aluminate phosphor, according to some embodiments.

In addition to applications in LED packages for lighting, CSS can also be used in a remote phosphor mode. CSS was used with GAL535 in a remote phosphor disk with CCT 4000K 90CRI. Compared with red nitride in the same remote phosphor disk, CSS materials showed ~11% brightness improvement and similar thermal quenching performance. At 80° C. both red nitride and CSS have a CE drop of ~5% compared to performance at 28° C. and the CSS still exhibits roughly 11% higher brightness than the red nitride reference (as Table 3 shows). FIG. 15 shows a typical white light emission spectra of a remote phosphor light emitting device with a remote phosphor wavelength conversion component comprising coated CSS phosphor and a green aluminate phosphor, according to some embodiments; the green phosphor is an aluminate phosphor, GAL535, available from Intematix Corp.

TABLE 3

CSS performance compared to red nitride in remote phosphor mode

| Sample | Temp. (° C.) | CIE x | CIE y | CCT (K) | CRI Ra | Flux (lm) | CE (lm/BW) | CE (%) | LE (lm/W) | LE (%) |
|---|---|---|---|---|---|---|---|---|---|---|
| CASN Red nitride | 28.3 | 0.3851 | 0.3868 | 3951 | 88.8 | 1766 | 197.5 | 100 | 300.9 | 100 |
| CSS | 28.5 | 0.3822 | 0.3866 | 4024 | 89.6 | 1966 | 219.8 | 111 | 338.0 | 112 |
| CASN Red nitride | 80 | 0.3821 | 0.3792 | 3970 | 91.1 | 1674 | 188.2 | 95 | 295.1 | 98 |
| CSS | 80 | 0.3735 | 0.3842 | 4241 | 87.6 | 1863 | 208.4 | 106 | 337.4 | 112 |

Figure 16:
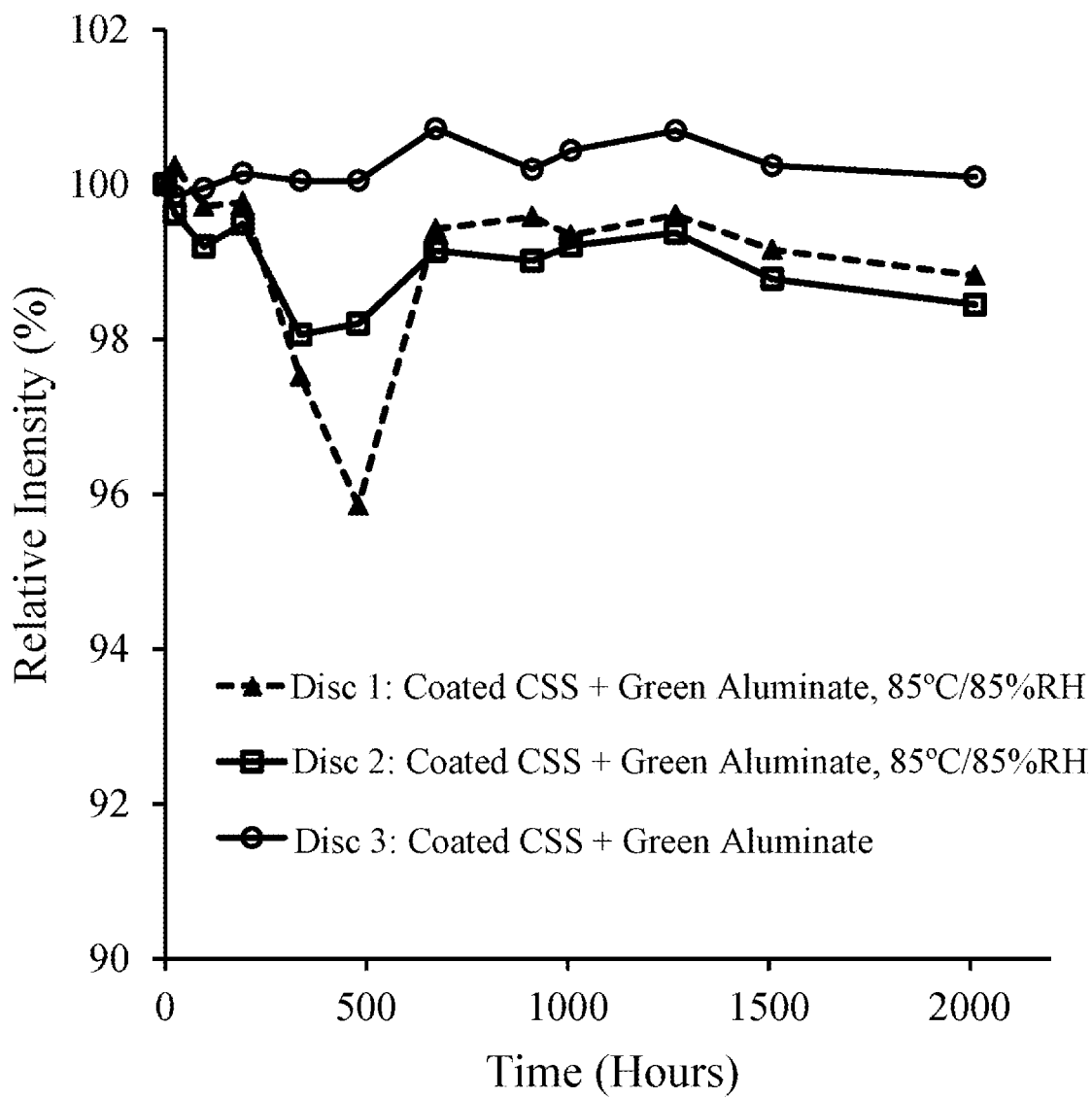
FIG. 16 shows reliability data, relative photoluminescence intensity versus time, for a white light remote phosphor light emitting device with a remote phosphor wavelength conversion component comprising coated CSS phosphor and a green aluminate phosphor, according to some embodiments for (i) Disc 1 operated under accelerated testing conditions 85° C./85% RH, (ii); Disc 2 operated under accelerated testing conditions 85° C./85% RH, and (iii) Disc 3 operated under room temperature conditions.
Figure 17:
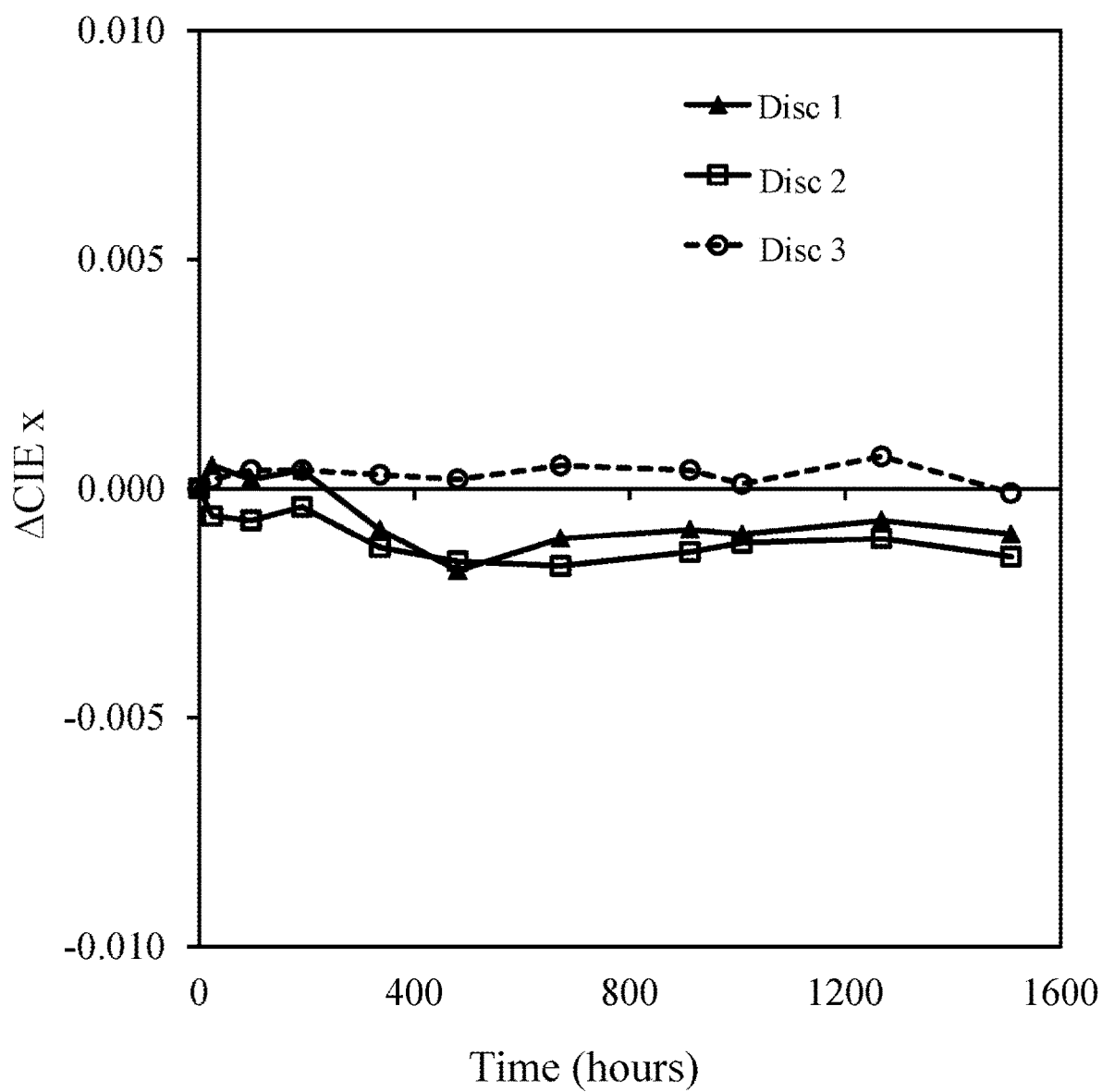
FIG. 17 shows reliability data, change of chromaticity Δ CIE x versus time, for a white light remote phosphor light emitting device with a remote phosphor wavelength conversion component comprising coated CSS phosphor and a green aluminate phosphor, according to some embodiments for (i) Disc 1 operated under accelerated testing conditions 85° C./85% RH, (ii); Disc 2 operated under accelerated testing conditions 85° C./85% RH, and (iii) Disc 3 operated under room temperature conditions.
Figure 18:
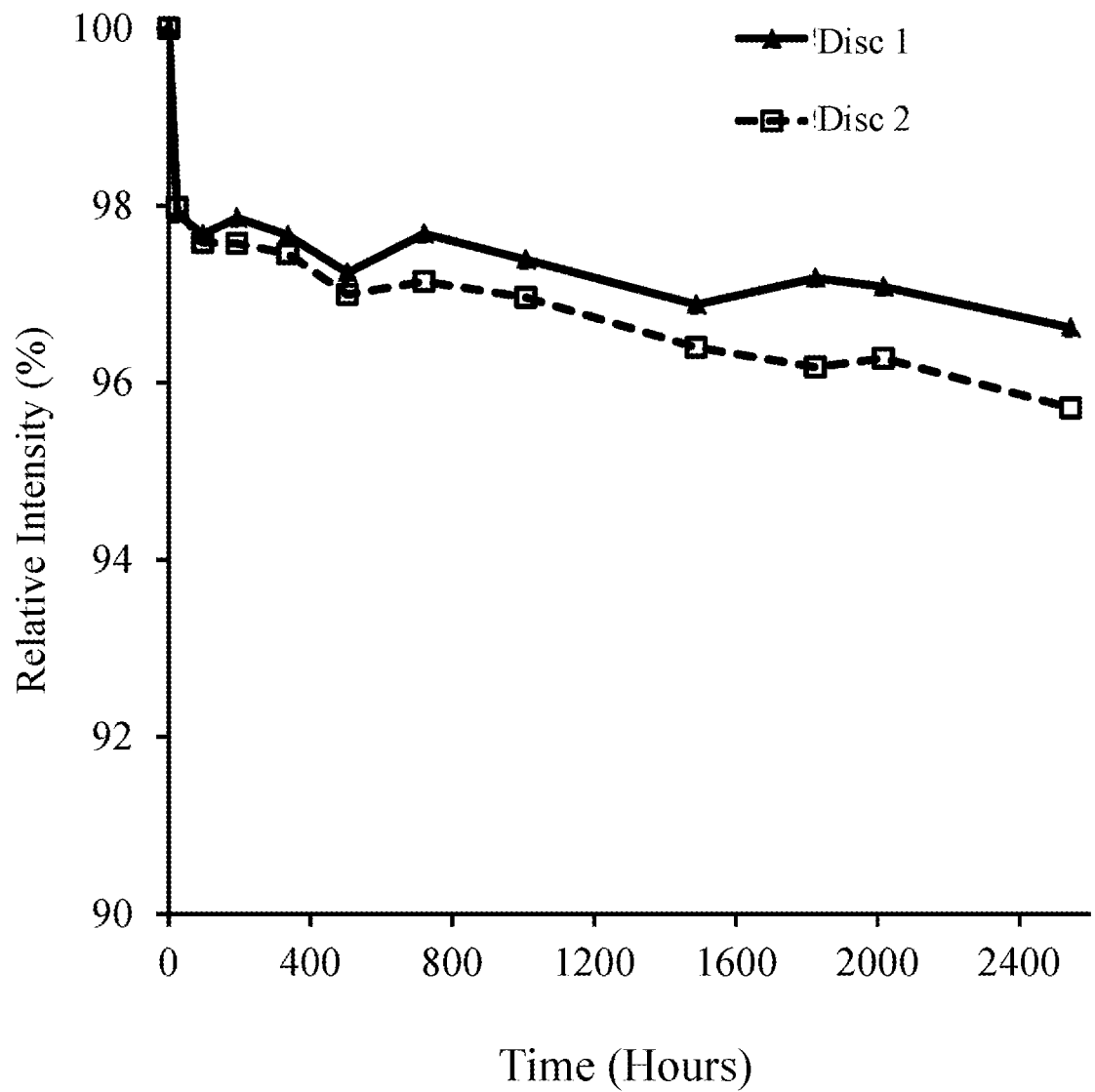
FIG. 18 shows reliability data, relative photoluminescence intensity versus time, for a white light remote phosphor light emitting device with a remote phosphor wavelength conversion component comprising coated CSS phosphor and a green aluminate phosphor, according to some embodiments for (i) Disc 1 stored under accelerated testing conditions 85° C./85% RH, and (ii) Disc 2 stored under accelerated testing conditions 85° C./85% RH.
Figure 19:
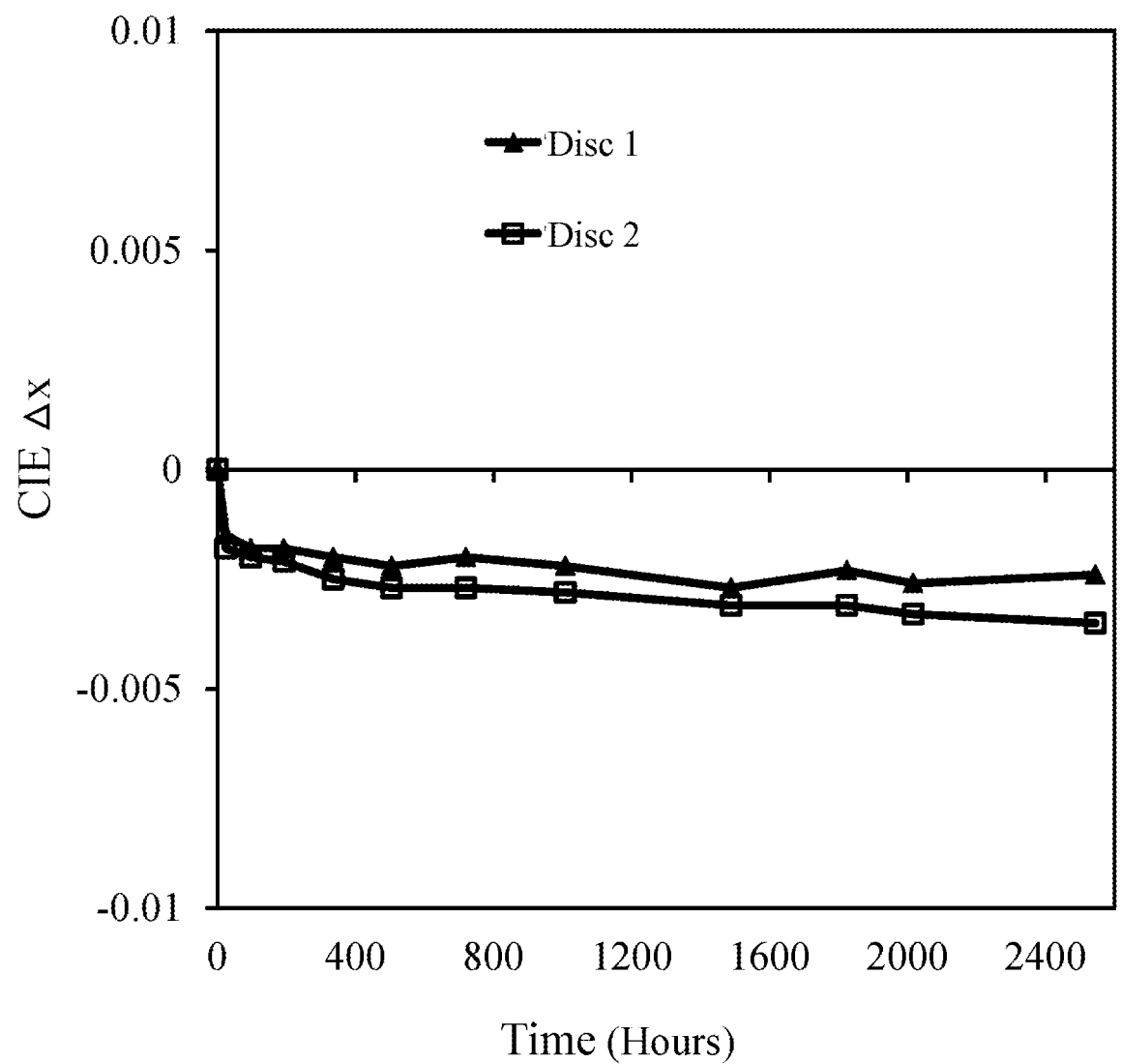
FIG. 19 shows reliability data, change of chromaticity Δ CIE x versus time, for a white light remote phosphor light emitting device with a remote phosphor wavelength conversion component comprising coated CSS phosphor and a green aluminate phosphor, according to some embodiments for (i) Disc 1 stored under accelerated testing conditions 85° C./85% RH, and (ii) Disc 2 stored under accelerated testing conditions 85° C./85% RH.

In remote phosphor applications, CSS materials (coated) also show excellent reliability performance, flat trend over 2000 hours in operation mode well within control limits for both brightness (greater than 90%) and color (CIE) changes (within +/−0.005) (FIGS. 16 & 17), and for storage over 3000 hours also shows a flat trend well within the same control limits (FIGS. 18 & 19). FIG. 16 shows reliability data, relative photoluminescence intensity versus time, for a white light remote phosphor light emitting device with a remote phosphor wavelength conversion component comprising coated CSS phosphor and a green aluminate phosphor, according to some embodiments for (i) Disc 1 operated under accelerated testing conditions 85° C./85% RH, (ii) Disc 2 operated under accelerated testing conditions 85° C./85% RH, and (iii) Disc 3 stored and operated under room temperature conditions—provided as a reference. FIG. 17 shows reliability data, change of chromaticity Δ CIE x versus time, for a white light remote phosphor light emitting device with a remote phosphor wavelength conversion component comprising coated CSS phosphor and a green aluminate phosphor, according to some embodiments for (i) Disc 1 operated under accelerated testing conditions 85° C./85% RH, (ii) Disc 2 operated under accelerated testing conditions 85° C./85% RH, and (iii) Disc 3 stored and operated under room temperature conditions—provided as a reference. FIG. 18 shows reliability data, relative photoluminescence intensity versus time, for a white light remote phosphor light emitting device with a remote phosphor wavelength conversion component comprising coated CSS phosphor and a green aluminate phosphor, according to some embodiments for (i) Disc 1 stored under accelerated testing conditions 85° C./85% RH, and (ii) Disc 2 stored under accelerated testing conditions 85° C./85% RH. FIG.

19 shows reliability data, change of chromaticity Δ CIE x versus time, for a white light remote phosphor light emitting device with a remote phosphor wavelength conversion component comprising coated CSS phosphor and a green aluminate phosphor, according to some embodiments for (i) Disc 1 stored under accelerated testing conditions 85° C./85% RH, and (ii) Disc 2 stored under accelerated testing conditions 85° C./85% RH.

Figure 20:
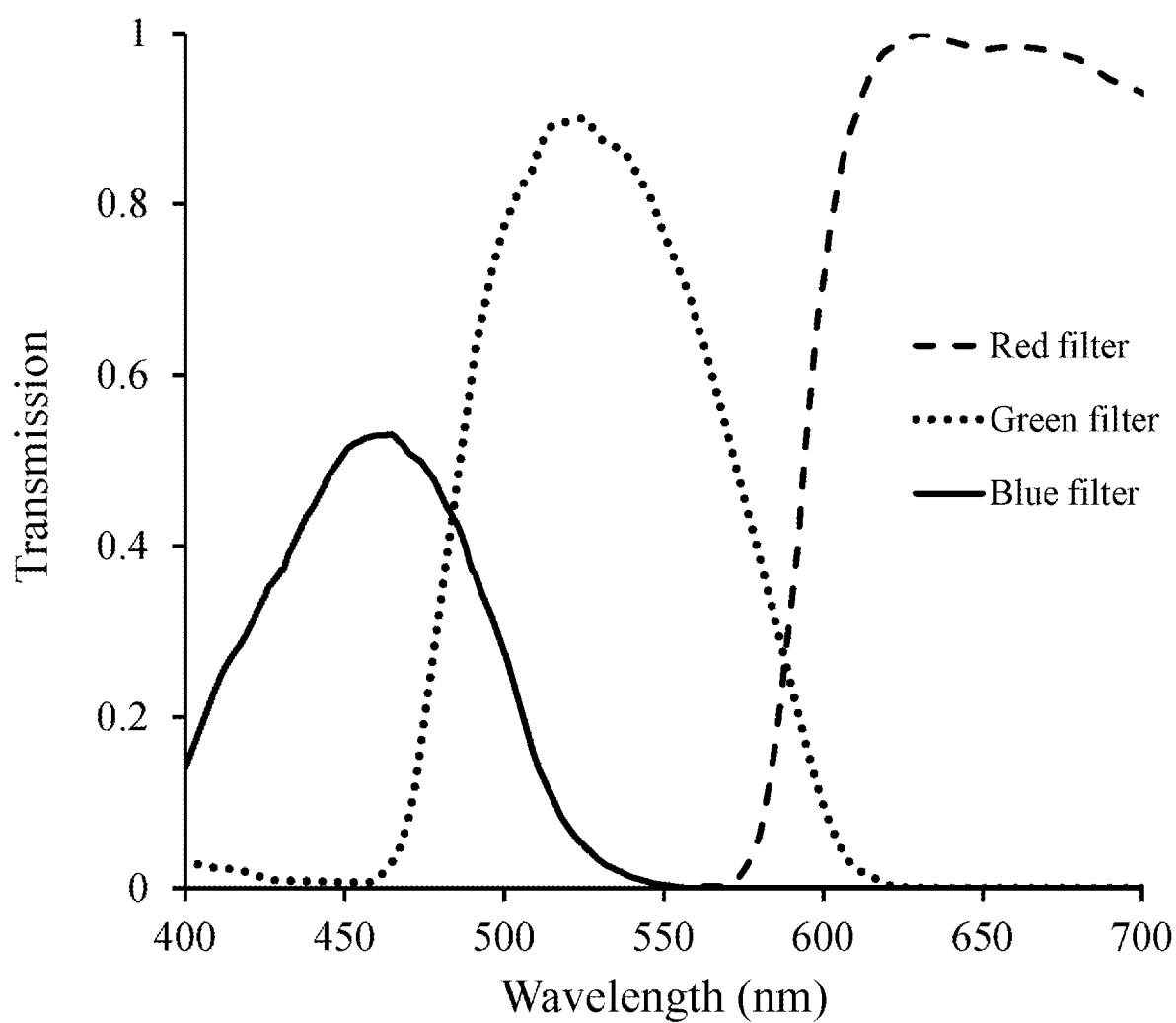
FIG. 20 shows the filtering characteristics, light transmission versus wavelength, for red, green and blue filter elements of an LCD display.
Figure 21:
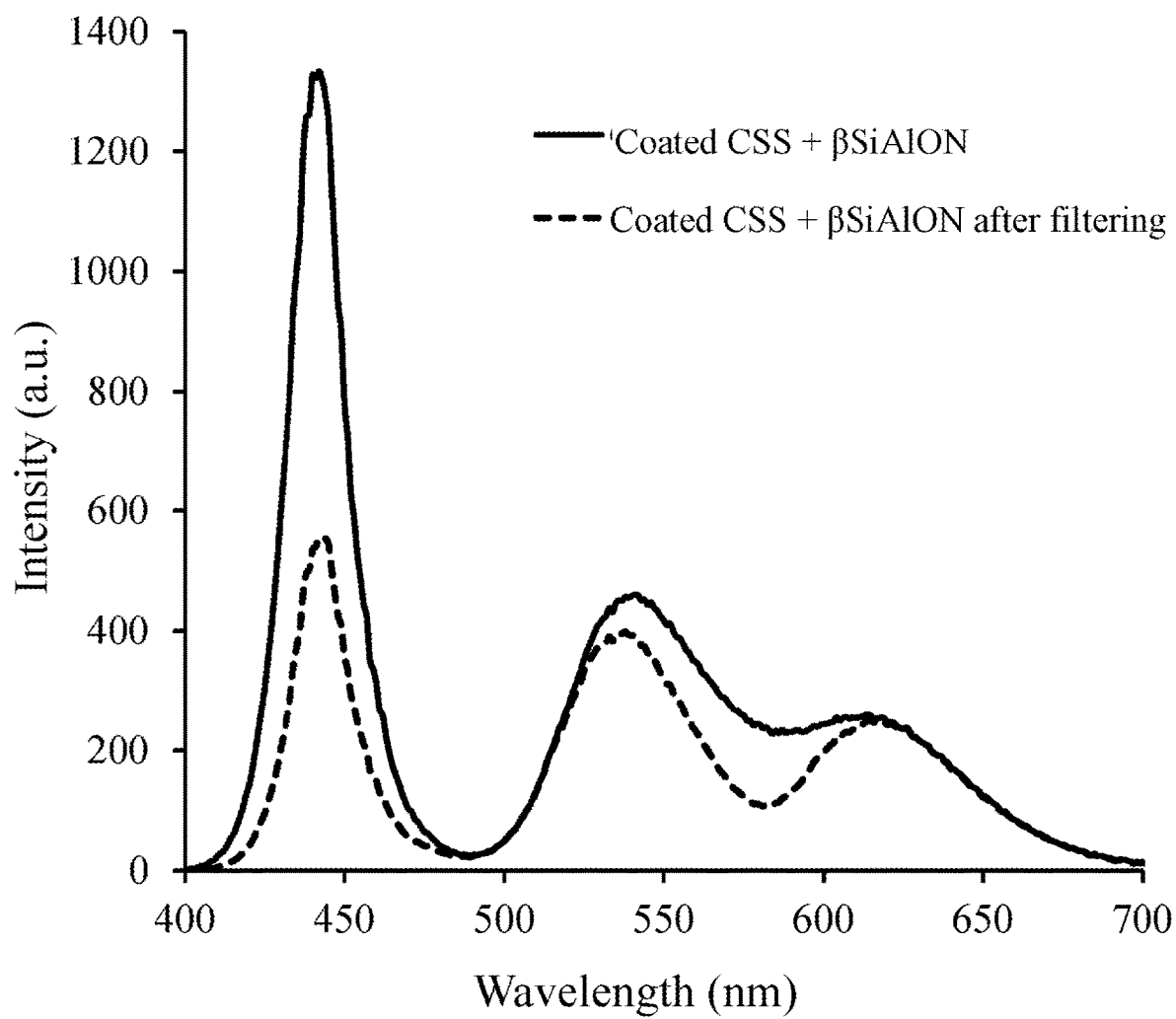
FIG. 21 white light emission spectra of a white light emitting device comprising coated CSS phosphor and a β-SiAlON (540 nm) phosphor, according to some embodiments and the emission spectrum after filtering.

In addition to its applications in general LED lighting applications, due to its narrow band red and suitable wavelength, CSS phosphors can also be used in back lighting. FIG. 20 shows the filtering characteristics, light transmission versus wavelength, for red, green and blue filter elements of an LCD display. FIG. 21 shows coated CSS phosphor particles, according to some embodiments, with β-SiAlON (540 nm) before and after filtering, which shows separation of blue, green and red peaks. Table 4 shows, when used with β-SiAlON (540 nm), red coated CSS phosphor with an emission wavelength of about 627 nm can achieve 88% of the area of the NTSC standard. Furthermore, the performance against the NTSC standard was found to increase with increasing emission wavelength of the red coated CSS phosphor. Note that the LCD white measurements are for an LCD operating to produce a white screen and using a backlight LED according to embodiments, and the LCD red/green/blue filter measurements are for light from the LCD which comes only through the particular color filter—red, green or blue.

TABLE 4

CSS + β-SiAlON540 used for backlighting

| Parameter | Value |
|---|---|
| Backlight LED CIE x | 0.280 |
| Backlight LED CIE y | 0.260 |
| Backlight LED Brightness (lm) | 21.008 |
| LCD white CIE x | 0.318 |
| LCD white CIE y | 0.343 |
| LCD Brightness (lm) | 16.08 |
| Brightness LCD/LED (%) | 76.5 |
| Red CIE x after LCD red filter | 0.664 |
| Red CIE y after LCD red filter | 0.336 |
| Green CIE x after LCD green filter | 0.285 |
| Green CIE y after LCD green filter | 0.659 |
| Blue CIE x after LCD blue filter | 0.157 |
| Blue CIE y after LCD blue filter | 0.032 |
| NTSC (%) | 88.2 |

Figure 22:
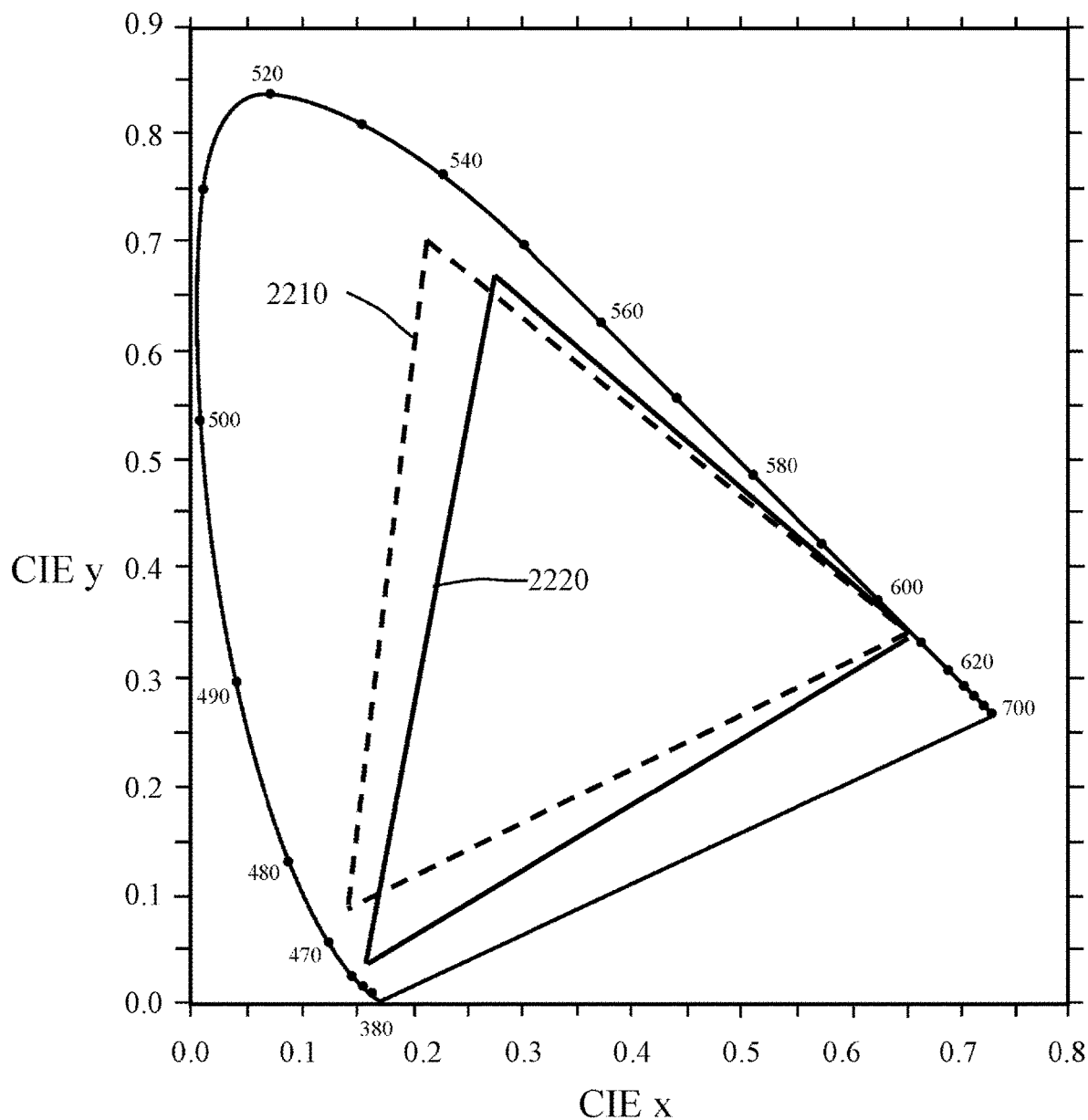
FIG. 22 shows the 1931 CIE color coordinates of the NTSC standard and the calculated RGB color coordinates from the white light source for which a spectrum is shown in FIG. 21, according to some embodiments.

White LEDs using combined blue LED and YAG:Ce phosphor have been widely used as backlights for personal computer LCD screens, LCD TVs and small-sized LCDs used in devices such as cellular phones and tablet displays. To date, the color gamut of these LEDs can attain approximately 70% of the area of the NTSC standard, and the widest color gamut using a narrow-band β-SiAlON:Eu green phosphor and CaAlSiN$_3$:Eu red phosphor can reach ~85% of the area of the NTSC standard with the assistance of typical LCD color filters. Cd-based green and red quantum dots (QDs) have reached a wider color gamut—more than 115% of the area of the NTSC standard in the 1931 CIE xy color space; however, Cd-based QDs are toxic and environmentally harmful. The widest color gamut that Cd-free QDs, such as InP/ZnS QDs, can reach is approximately 87% relative to the NTSC standard. However, the combination of a red coated CSS phosphor, as described herein, with an emission wavelength of about 627 nm, with various narrow band green phosphors such as β-SiAlON:Eu or SrGa$_2$S$_4$:Eu, can reach approximately 88% of the area of the NTSC standard. See FIG. 22 which shows the 1931 CIE color coordinates of the NTSC standard (callout 2210) and the calculated RGB coordinates from a white light source comprising a blue LED (451 nm) combined with the red coated CSS phosphor of the present invention with the green phosphor β-SiAlON:Eu (540 nm) (callout 2220); this is the same white light source for which a spectrum is shown in FIG. 21 and described above in Table 4. Note that herein references to the percentage of the area of the NTSC standard are percentages of the area of the NTSC (National Television System Committee) 1953 color gamut specification as mapped on the CIE 1931 xy chromaticity diagram. Furthermore, when the wavelength of the red coated CSS phosphor, as described herein, with an emission wavelength of about 635 nm in combination with green phosphor such as β-SiAlON:Eu or SrGa$_2$S$_4$:Eu, can reach more than 93% of the area of the NTSC standard.

It is expected that some embodiments of the coated narrow band red CSS phosphors of the present invention when combined with one of the various possible narrow band green phosphors such as β-SiAlON:Eu, SrGa$_2$S$_4$:Eu or InP/ZnS green quantum dots are able to reach high efficiencies and high levels of color gamut for LED backlight applications, where the phosphors are integrated into "on-chip", "on-edge" or "on-film" LED backlights. Furthermore, it is expected that the performance of some embodiments of the coated narrow band red phosphors of the present invention in combination with one of the various possible narrow band green phosphors will provide higher efficiencies and higher levels of color gamut compared with red nitride phosphors such as (Ba,Sr)$_2$Si$_5$N$_8$:Eu$^{2+}$ or (Ca,Sr)AlSiN$_3$:Eu$^{2+}$ in combination with the same narrow band green phosphors.

Although examples of the present invention have been described with reference to CSS phosphor particles coated with a single material, in certain embodiments, it is envisaged that the coatings comprise multiple layers with combinations of the coating materials described herein. Furthermore, the combination coatings may be coatings with an abrupt transition between the first and second materials, or may be coatings in which there is a gradual transition from the first material to the second material thus forming a zone with mixed composition that varies through the thickness of the coating.

Although the present invention has been described with reference to phosphors for display applications, in embodiments the phosphors of the present invention may be used in high CRI (color rendering index) white light applications when used in combination with a broad band red emitting phosphor such as Eu$^{2+}$ or Ce$^{3+}$ doped (oxy)nitride compounds, for example (Ba,Sr)$_2$Si$_5$N$_8$:Eu$^{2+}$ and (Ca,Sr)AlSiN$_3$:Eu$^{2+}$.

Although the present invention has been particularly described with reference to phosphor compounds in which M is one or more alkaline earth metals, in embodiments some amount of other metals such as zinc, lithium or cadmium may substitute for some of the alkaline earth metal.

Although the present invention has been particularly described with reference to coated narrow band red phosphors with general composition MSe$_{1-x}$S$_x$:Eu, wherein M is at least one of Mg, Ca, Sr, Ba and Zn and 0<x<1.0, it is expected that the teaching and principles of the present invention will apply more generally to materials of composition MZ:Eu, wherein M is at least one of Mg, Ca, Sr, Ba, and Z is one or more of S and Se—for example, (Ca,Sr)S:Eu.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A coated phosphor comprising:
   phosphor particles of composition $MSe_{1-x}S_x$: Eu, wherein M is at least one of Mg, Ca, Sr, Ba and Zn and $0<x<1.0$ having a moisture resistant coating of an oxide material on individual ones of said phosphor particles;
   wherein the coated phosphor is configured to satisfy at least one of the conditions:
   (1) a reduction in relative intensity after 1,000 hours at 85° C. and 85% relative humidity is no greater than 15%;
   (2) a reduction in relative intensity after 1,000 hours at 85° C. and 85% relative humidity is no greater than 10%;
   (3) a change in chromaticity coordinate CIE(x) after 1,000 hours at 85° C. and 85% relative humidity is no greater than $10 \times 10^{-3}$;
   (4) a change in chromaticity coordinate CIE(x) after 1,000 hours at 85° C. and 85% relative humidity is no greater than $5 \times 10^{-3}$;
   (5) said coated phosphor does not turn black when suspended in a 1 mol/L silver nitrate solution for at least 2 hours at 85° C.;
   (6) said coated phosphor does not turn black when suspended in a 1 mol/L silver nitrate solution for at least 5 days at 20° C.; and
   (7) said coated phosphor is configured such that said coated phosphor does not turn black when suspended in a 1 mol/L silver nitrate solution for at least 30 days at 20° C.

2. The coated phosphor of claim 1, wherein said oxide is at least one of: alumina, silicon oxide, titanium oxide, zinc oxide, magnesium oxide, zirconium oxide and chromium oxide.

3. The coated phosphor of claim 1, wherein said coating has a thickness from 100 nm to 5 μm.

4. The coated phosphor of claim 1, wherein said phosphor particles have a diameter from 5 μm to 20 μm.

5. The coated phosphor of claim 1, wherein M is at least Ca.

6. The coated phosphor of claim 5, wherein said coated phosphor has a peak photoluminescence emission wavelength from 600 nm to 650 nm and a FWHM from 48 nm to 60 nm.

7. A white light emitting device comprising:
   an excitation source with emission wavelength from 200 nm to 480 nm;
   a first phosphor of composition $MSe_{1-x}S_x$: Eu in which M is at least one of Mg, Ca, Sr, Ba and Zn and $0<x<1.0$, wherein said first phosphor has a moisture resistant coating of an oxide on individual particles of said first phosphor and has a first peak emission wavelength; and
   a second phosphor with a second peak emission wavelength different to said first photoluminescence peak wavelength.

8. The white light emitting device of claim 7, wherein said first peak emission wavelength is from about 600 nm to about 650 nm; and
   said second peak emission wavelength is from about 515 nm to about 570 nm.

9. The white light emitting device of claim 7, wherein the device has a lumen efficacy of at least 335 lm/W.

10. A white light emission device for backlighting, comprising:
    an excitation source with an emission wavelength from 440 nm to 480 nm;
    a first phosphor of composition $MSe_{1-x}S_x$: Eu in which M is at least one of Mg, Ca, Sr, Ba and Zn and $0<x<1.0$, wherein said first phosphor has a moisture resistant coating of oxide on individual particles of said first phosphor and has a peak emission wavelength from 625 nm to 645 nm; and
    a second phosphor with a peak emission wavelength from 520 nm to 545 nm;
    wherein said backlight generates light with a color gamut of at least 85% of NTSC.

11. The backlight white light emission device for backlighting of claim 2, wherein said backlight generates light with a color gamut of at least 90% up to 93% of NTSC.

12. The backlight white light emission device for backlighting of claim 2, wherein said second phosphor comprises one of β-SiAlON :Eu and $SrGa_2S_4$:Eu.

* * * * *